(12) United States Patent
Park et al.

(10) Patent No.: US 12,451,471 B2
(45) Date of Patent: Oct. 21, 2025

(54) DISPLAY DEVICE AND TILED DISPLAY DEVICE

(71) Applicant: Samsung Display Co., Ltd., Yongin-si (KR)

(72) Inventors: Kwangsu Park, Yongin-si (KR); Sae-Hee Ryu, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 211 days.

(21) Appl. No.: 17/450,357

(22) Filed: Oct. 8, 2021

(65) Prior Publication Data

US 2022/0231001 A1 Jul. 21, 2022

(30) Foreign Application Priority Data

Jan. 19, 2021 (KR) ........................ 10-2021-0007527

(51) Int. Cl.
*G09F 9/30* (2006.01)
*H01L 23/00* (2006.01)
*H01L 25/16* (2023.01)
*H10K 59/12* (2023.01)

(52) U.S. Cl.
CPC ............ *H01L 25/167* (2013.01); *H01L 24/32* (2013.01); *H01L 25/162* (2013.01); *H01L 2224/32137* (2013.01); *H10K 59/12* (2023.02)

(58) Field of Classification Search
CPC .............. G02F 1/133305; G09F 9/301; G09G 2380/02; H01L 2251/5338; H01L 51/0097
See application file for complete search history.

(56) References Cited

U.S. PATENT DOCUMENTS

| 8,947,391 | B1* | 2/2015 | Guard | G06F 3/0445 |
| | | | | 178/18.05 |
| 2013/0002583 | A1* | 1/2013 | Jin | G06F 3/041 |
| | | | | 313/511 |
| 2013/0335660 | A1* | 12/2013 | Jung | G02F 1/13452 |
| | | | | 438/30 |

(Continued)

FOREIGN PATENT DOCUMENTS

| CN | 111564113 A | * | 8/2020 | ............ G09F 9/301 |
| KR | 10-0740906 B1 | | 7/2007 | |

(Continued)

*Primary Examiner* — Yuzhen Shen
(74) *Attorney, Agent, or Firm* — Womble Bond Dickinson (US) LLP

(57) ABSTRACT

A display device includes an active panel including a display area including a plurality of pixels and a non-display area surrounding the display area, the non-display area including an adjacent area adjacent to the display area and bending areas spaced from the display area by the adjacent area, the bending areas including a connection electrode and a first driving panel in contact with a first bending area of the active panel by a first connection member, and electrically coupled to the active panel. Each of the bending areas is bent in a direction perpendicular to a plane formed by the display area, and the active panel includes an opening in the first bending area exposing the connection electrode, and the first connection member is configured to couple a first signal from the first driving panel to the active panel through the connection electrode.

10 Claims, 24 Drawing Sheets

(56) References Cited

U.S. PATENT DOCUMENTS

| | | | |
|---|---|---|---|
| 2014/0306941 A1* | 10/2014 | Kim | H10K 59/131 |
| | | | 345/204 |
| 2017/0309698 A1 | 10/2017 | Bower et al. | |
| 2019/0094641 A1* | 3/2019 | Choi | H10K 77/111 |
| 2019/0131562 A1* | 5/2019 | Rhe | H10K 59/131 |
| 2019/0206784 A1* | 7/2019 | Oh | H01L 23/49838 |
| 2021/0096668 A1* | 4/2021 | Kwon | B32B 27/286 |
| 2022/0384492 A1* | 12/2022 | Lu | H01L 27/15 |

FOREIGN PATENT DOCUMENTS

| | | |
|---|---|---|
| KR | 10-2014-0099592 A | 8/2014 |
| KR | 10-1895217 B1 | 9/2018 |

\* cited by examiner

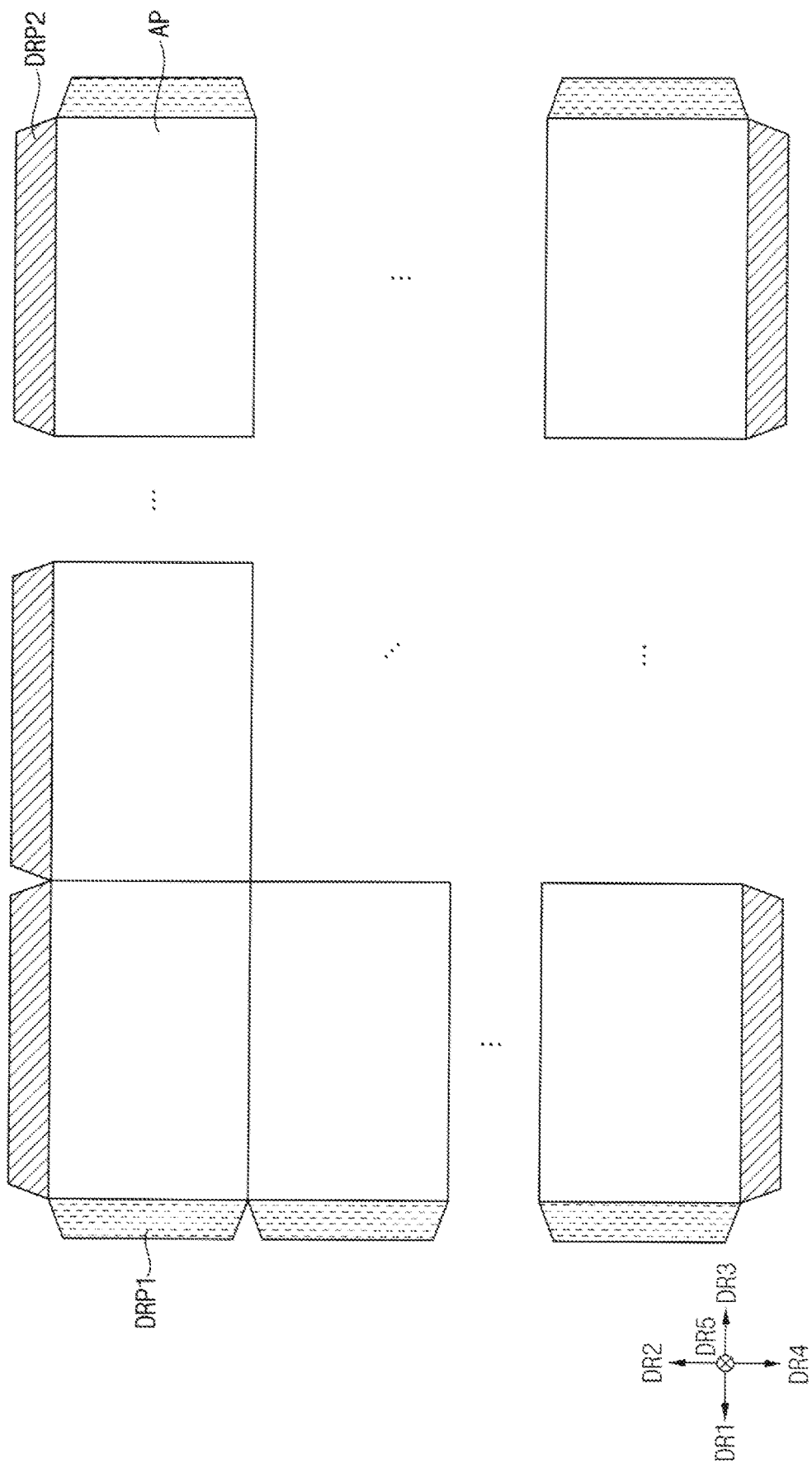

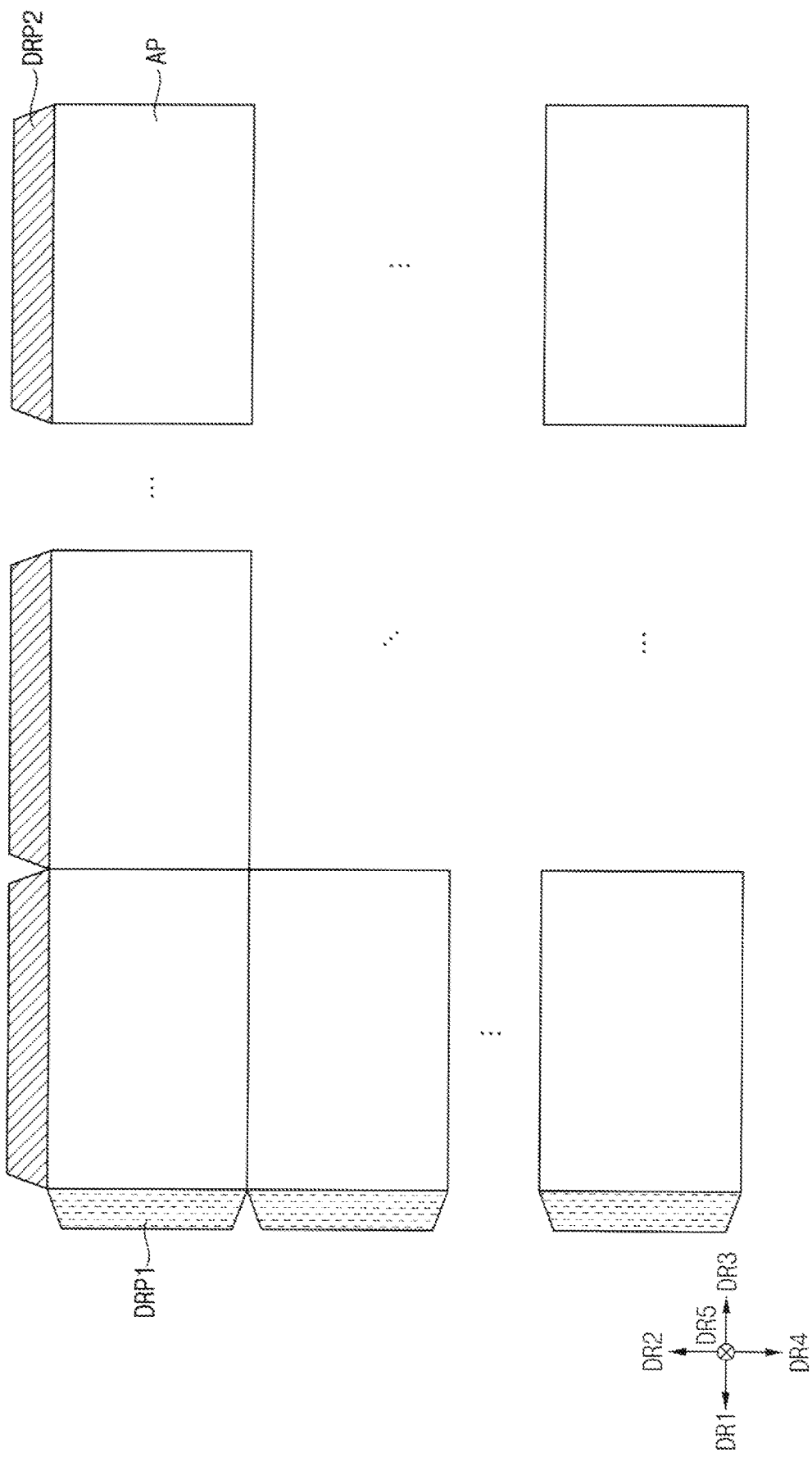

FIG. 8
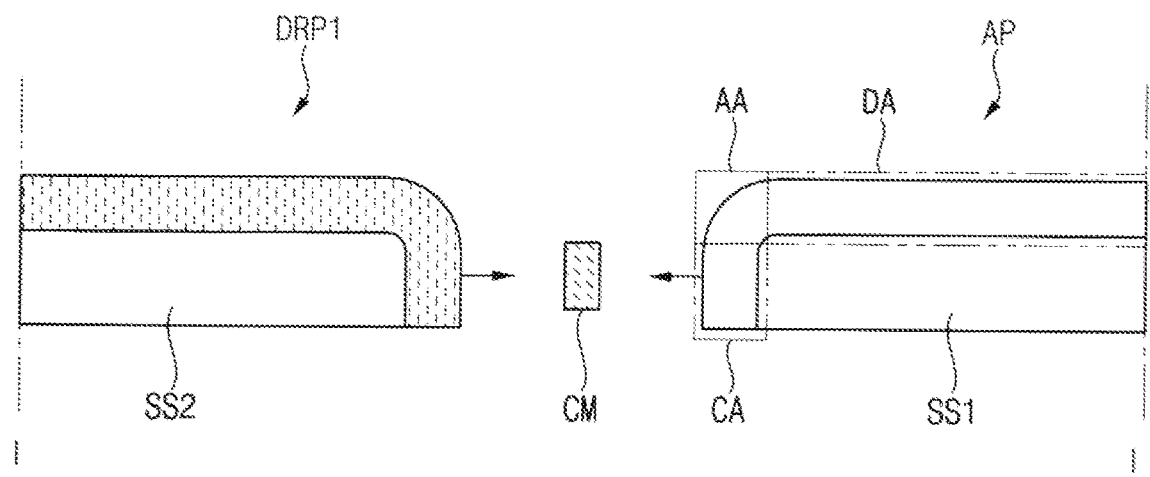
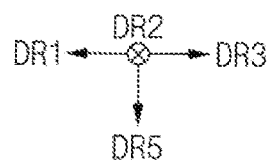
FIG. 9
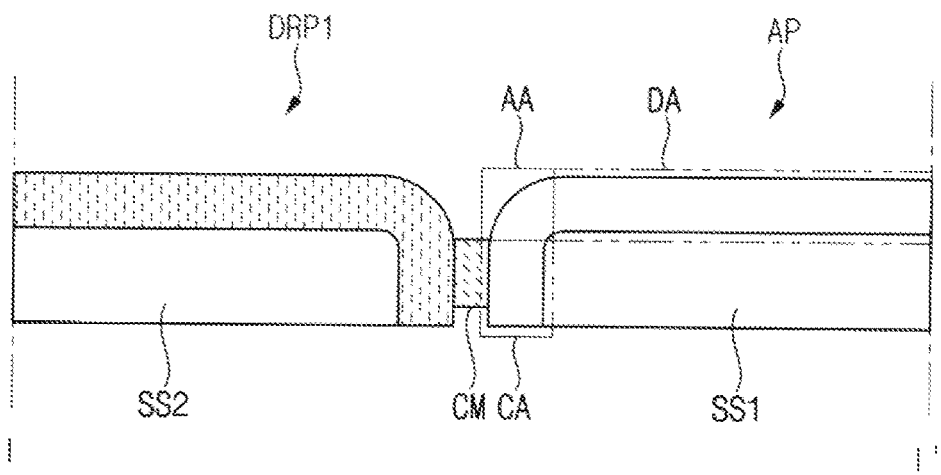
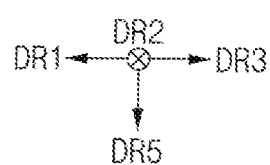

FIG. 10
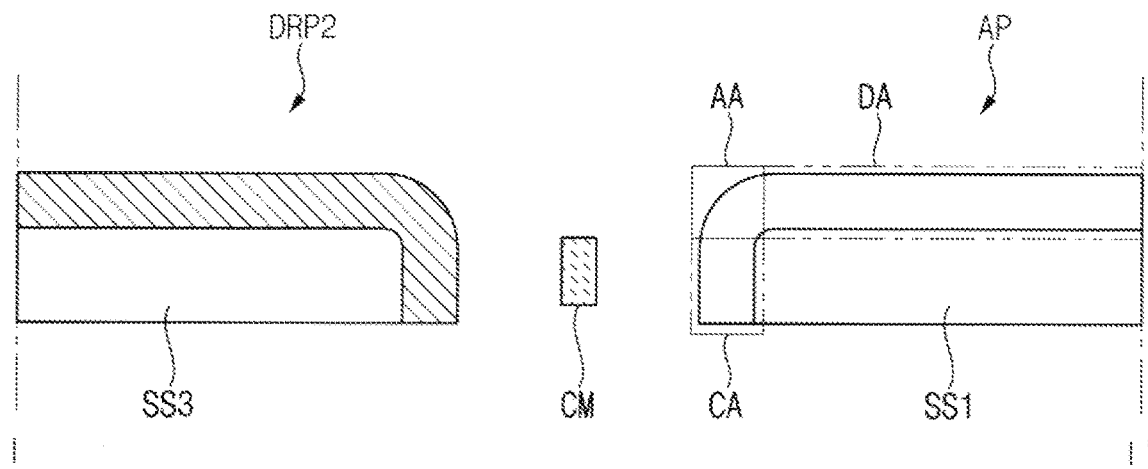
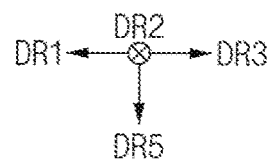
FIG. 11
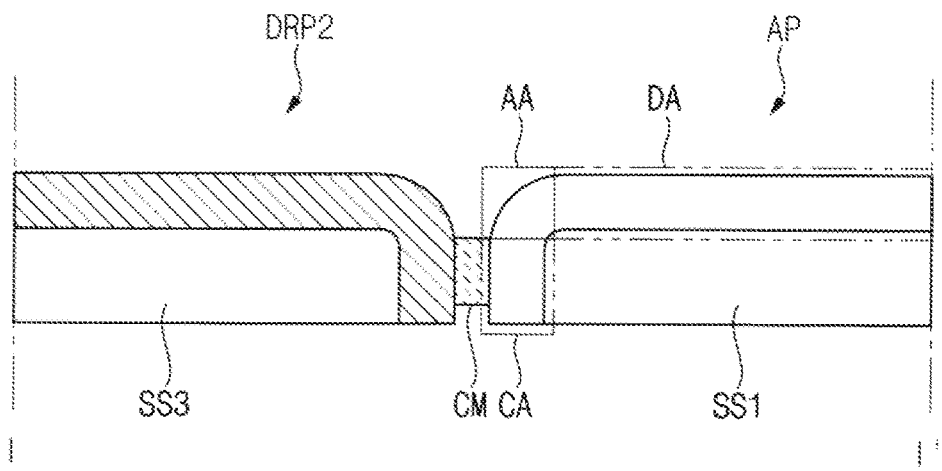
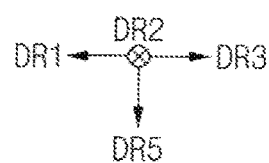

FIG. 17
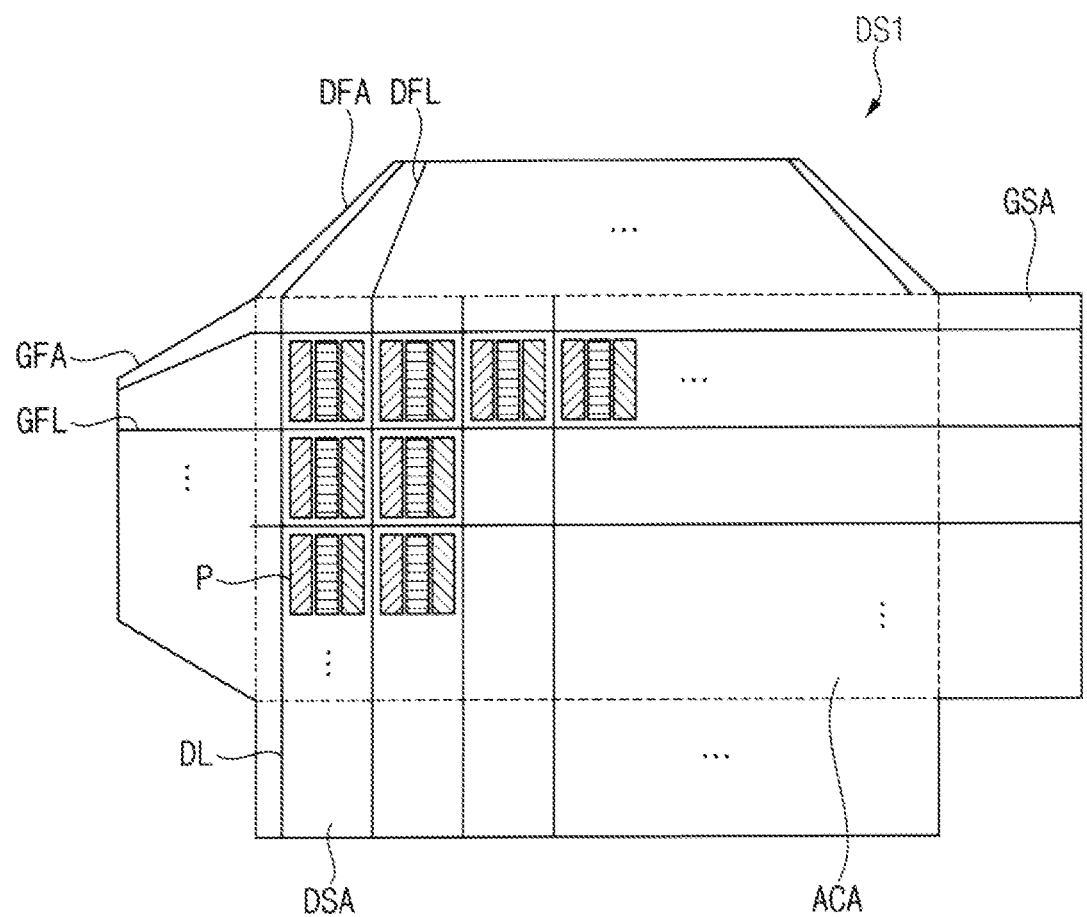
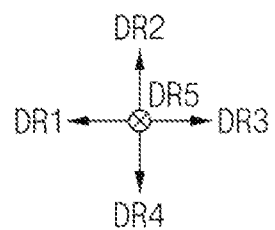

DISPLAY DEVICE AND TILED DISPLAY DEVICE

CROSS-REFERENCE TO RELATED APPLICATION

This application claims priority to and the benefit of Korean Patent Application No. 10-2021-0007527, filed on Jan. 19, 2021, the content of which in its entirety is herein incorporated by reference.

BACKGROUND

1. Field

Embodiments of the invention relate to a display device and a tiled display device.

2. Description of the Related Art

Various types of display devices are produced, such as for example, organic light emitting display devices and liquid crystal display devices. In addition, display devices are also produced in various sizes. Therefore, in order to produce such display devices of different sizes, the production process is often divided and operated according to the different sizes.

SUMMARY

Some embodiments of the invention provide a display device, and some embodiments of the invention also provide and a tiled display device.

According to an embodiment, a display device may include: an active panel including: a display area including a plurality of pixels; and a non-display area surrounding the display area, the non-display area including an adjacent area adjacent the display area and bending areas spaced from the display area by the adjacent area, the bending areas including a connection electrode; and a first driving panel coupled with a first bending area of the bending areas by a first connection member, and electrically coupled to the active panel, wherein each of the bending areas is bent in a direction perpendicular to a plane from by the display area, wherein the active panel includes an opening in the first bending area exposing the connection electrode, and wherein the first connection member is configured to couple a first signal from the first driving panel to the active panel through the connection electrode.

In another embodiment, the first connection member may include an anisotropic conductive film, a connector, or a solder joint.

In another embodiment, the display device may further include: a first support substrate, wherein the display area of the active panel is bonded to an upper surface of the first support substrate, and wherein the bending areas of the active panel are bonded to side surfaces of the first support substrate; and a second support substrate, wherein the first driving panel is bonded to an upper surface of the second support substrate, and wherein the first driving panel is folded and bonded to a side surface of the second support substrate.

In another embodiment, a width of the adjacent area may be about half the distance between adjacent pixels among the pixels.

In another embodiment, the display device may further include: a second driving panel coupled to a second bending area bonded to a side surface of the first support substrate that is perpendicular to a side surface of the first support substrate that is bonded to the first bending area, among the side surfaces of the first support substrate, wherein the second driving panel is configured to apply a second signal different from the first signal, and wherein the active panel and the second driving panel are coupled by a second connection member.

In another embodiment, the first driving panel may be configured to apply a gate signal to the active panel, and the second driving panel is configured to apply a data signal to the active panel.

In another embodiment, the display device may further include: a second driving panel coupled to a second bending area bonded to a side surface of the first support substrate opposite to a side surface of the first support substrate that is bonded to the first bending area, among the side surfaces of the first support substrate, and wherein the active panel and the second driving panel are coupled by a second connection member.

In another embodiment, the first and second driving panels may be configured to apply a gate signal or a data signal to the active panel.

In another embodiment, the first driving panel may be configured to apply a data signal and a gate signal to the active panel.

In another embodiment, the display device may further include an alignment mark on at least one of the bending areas.

According to another embodiment, a tiled display device may include: a display panel including a plurality of pixels arranged in a matrix form, and active panels electrically coupled to each other; a first driving panel electrically coupled to the display panel at a first side surface of the display panel by a first connection member and configured to apply a first gate signal to the display panel; and a second driving panel electrically coupled to the display panel at a second side surface perpendicular to the first side surface of the display panel by a second connection member and configured to apply a first data signal to the active panels.

In another embodiment, the active panels may be electrically coupled by a third connection member, respectively, in a row direction, and electrically coupled by a fourth connection member, respectively, in a direction perpendicular to the row direction.

In another embodiment, each of the first to fourth connection members may include an anisotropic conductive film, a connector, or a solder joint.

In another embodiment, the tiled display device may further include: a third driving panel electrically coupled to the display panel on a third side surface opposite the first side surface of the display panel by a fifth connection member and configured to apply a second gate signal to the active panels; and a fourth driving panel electrically coupled to the display panel on a fourth side surface opposite the second side surface of the display panel by a sixth connection member and configured to apply a second data signal to the active panels, and wherein each of the fifth connection member and the sixth connection member includes an anisotropic conductive film, a connector, or a solder joint.

In another embodiment, each of the active panels may include a display area including the pixels and a non-display area surrounding the display area, and wherein the non-display area includes an adjacent area adjacent the display area and a bending area spaced from the display area by the adjacent area.

In another embodiment, the tiled display device may further include: a plurality of first support substrates respectively bonded to the active panels; a second support substrate bonded to the first driving panel; and a third support substrate bonded to the second driving panel, wherein the display area of the active panels is bonded to an upper surface of the plurality of first support substrates, and the bending areas of the active panels are bonded to side surfaces of the plurality of first support substrates, wherein the first driving panel is bonded to an upper surface of the second support substrate, and the first driving panel is folded to a side surface of the second support substrate and bonded thereto, and wherein the second driving panel is bonded to an upper surface of the third support substrate, and the second driving panel is folded to a side surface of the third support substrate and bonded thereto.

In another embodiment, a width of the adjacent area may be about half the distance between adjacent pixels among the pixels.

In another embodiment, the active panels may be electrically coupled to each other through the bending areas, the first driving panel is electrically coupled to the bending areas of the active panels on the first side surface of the display panel, and the second driving panel is electrically coupled to the bending areas of the active panels on the second side surface of the display panel.

According to another embodiment, a tiled display device may include: a first active panel including: a first active area; a first gate fan-out area arranged in a first direction from the first active area; a first data fan-out area arranged in a second direction perpendicular to the first direction from the first active area; a first gate transfer area arranged in a third direction opposite the first direction from the first active area; and a first data transfer area arranged in a fourth direction opposite the second direction from the first active area, wherein the first gate transfer area and the first data transfer area are bent in a fifth direction perpendicular to the first direction and the second direction.

In another embodiment, the tiled display device may further include: a second active panel including: a second active area; a second gate transfer area arranged in the first direction from the second active area and coupled to the first gate transfer area by a first connection member; and a second data fan-out area arranged in the second direction from the second active area, wherein the second gate transfer area is bent in the fifth direction.

In another embodiment, the second active panel may further include: a second gate fan-out area arranged in the third direction from the second active area; a second data transfer area arranged in the fourth direction from the second active area, and wherein the second data transfer area is bent in the fifth direction.

In another embodiment, the second active panel may further include: a third gate transfer area arranged in the third direction from the second active area; and a second data transfer area arranged in the fourth direction from the second active area, wherein the third gate transfer area and the second data transfer area are bent in the fifth direction.

In another embodiment, the tiled display device may further include: a third active panel and a fourth active panel, wherein the third active panel includes: a third active area; a second gate fan-out area arranged in the first direction from the third active area; and a third data transfer area arranged in the second direction from the third active area and coupled to the first data transfer area by a second connection member, and wherein the fourth active panel includes: a fourth active area; a fourth gate transfer area arranged in the first direction from the fourth active area and coupled to the third gate transfer area by a third connection member; and a fourth data transfer area arranged in the second direction from the fourth active area and coupled to the second data transfer area by a fourth connection member, and wherein the third data transfer area, the third gate transfer area, the fourth gate transfer area, and the fourth data transfer area are bent in the fifth direction.

In another embodiment, the third active panel may further include a fifth data transfer area arranged in the fourth direction from the third active area, wherein the fourth active panel further includes a sixth data transfer area arranged in the fourth direction from the fourth active area and a fifth gate transfer area arranged in the third direction from the fourth active area, wherein the second active panel further includes a sixth gate transfer area arranged in the third direction from the second active area, and wherein the fifth data transfer area, the sixth data transfer area, the fifth gate transfer area, and the sixth gate transfer area are bent in the fifth direction.

In another embodiment, the third active panel may further include a third data fan-out area arranged in the fourth direction from the third active area, wherein the fourth active panel further includes a fourth data fan-out area arranged in the fourth direction from the fourth active area and a fifth gate fan-out area arranged in the third direction from the fourth active area, and wherein the second active panel further includes a sixth gate fan-out area arranged in the third direction from the second active area.

Accordingly, the display device may be manufactured by modularizing each of the active panel and the driving panel, and then coupling the active panels and the driving panels to each other by connecting members to assemble the display device.

Accordingly, when manufacturing display devices having different sizes, it is possible to manufacture display devices of various sizes by connecting the active panels together.

BRIEF DESCRIPTION OF THE DRAWINGS

The above and other features of the inventive concept will become more apparent as described in the detailed embodiments thereof with reference to the accompanying drawings, in which:

FIGS. 7A and 7B are plan views illustrating some embodiments of a display panel included in the display device of FIG. 1.

FIGS. 8 to 11 are diagrams schematically illustrating some embodiments in which an active panel and a driving panel are coupled.

FIGS. 17 to 23 are diagrams illustrating display panels according to some embodiments.

DETAILED DESCRIPTION

Hereinafter, embodiments of the invention will be described in more detail with reference to the accompanying drawings.

Figure 1:
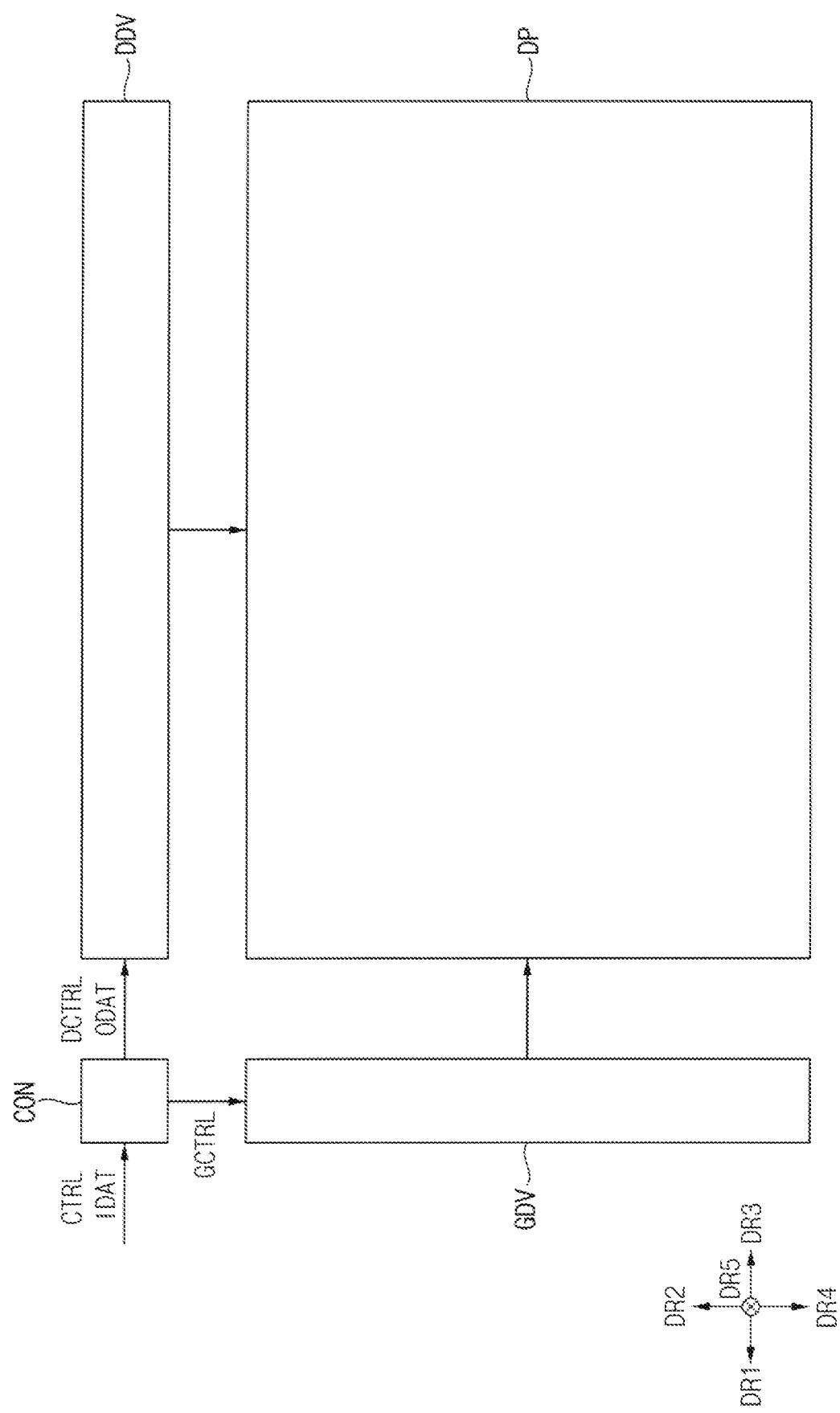
FIG. 1 is a block diagram illustrating a display device according to some embodiments.

FIG. 1 is a block diagram illustrating a display device according to some embodiments.

Referring to FIG. 1, the display may include at least a display panel DP, a data driver DDV, a gate driver GDV, and a timing controller CON.

In some embodiments, the display device may display an image through the display panel DP. To this end, the display panel DP may include a plurality of pixels and light emitting elements coupled to the pixels. In embodiments, the display panel DP may be configured as a single panel. Alternatively, in some embodiments, the display panel DP may include a plurality of panels.

In some embodiments, the timing controller CON may generate a gate control signal GCTRL, a data control signal DCTRL, and an output image data ODAT based on a control signal CTRL and an input image data IDAT provided from the outside (e.g., from external to the display device). For example, the control signal CTRL may include a vertical synchronization signal, a horizontal synchronization signal, an input data enable signal, a master clock signal, and the like. For example, the input image data IDAT may be RGB data including red image data, green image data, and blue image data. Alternatively, the input image data IDAT may include magenta image data, cyan image data, and yellow image data, or other suitable types of input image data.

In some embodiments, the gate driver GDV may generate gate signals based on the gate control signal GCTRL provided from the timing controller CON. For example, the gate control signal GCTRL may include a vertical start signal, a clock signal, and the like. In some embodiments, the gate driver GDV may be manufactured as a separate panel and coupled to the display panel DP. The gate driver GDV is electrically coupled to the display panel DP and may sequentially output the gate signals. Each of the pixels may receive a data voltage based on control from each of the gate signals.

In some embodiments, the data driver DDV may generate the data voltage based on the data control signal DCTRL and the output image data ODAT provided from the timing controller CON. For example, the data control signal DCTRL may include an output data enable signal, a horizontal start signal, and a load signal. In some embodiments, the data driver DDV may be manufactured as a separate panel and electrically coupled to the display panel DP. In some embodiments, the data driver DDV is electrically coupled to the display panel DP and may generate a plurality of data voltages. Each of the pixels may transmit a signal to the light emitting elements for luminance corresponding to each of the data voltages.

Figure 2:
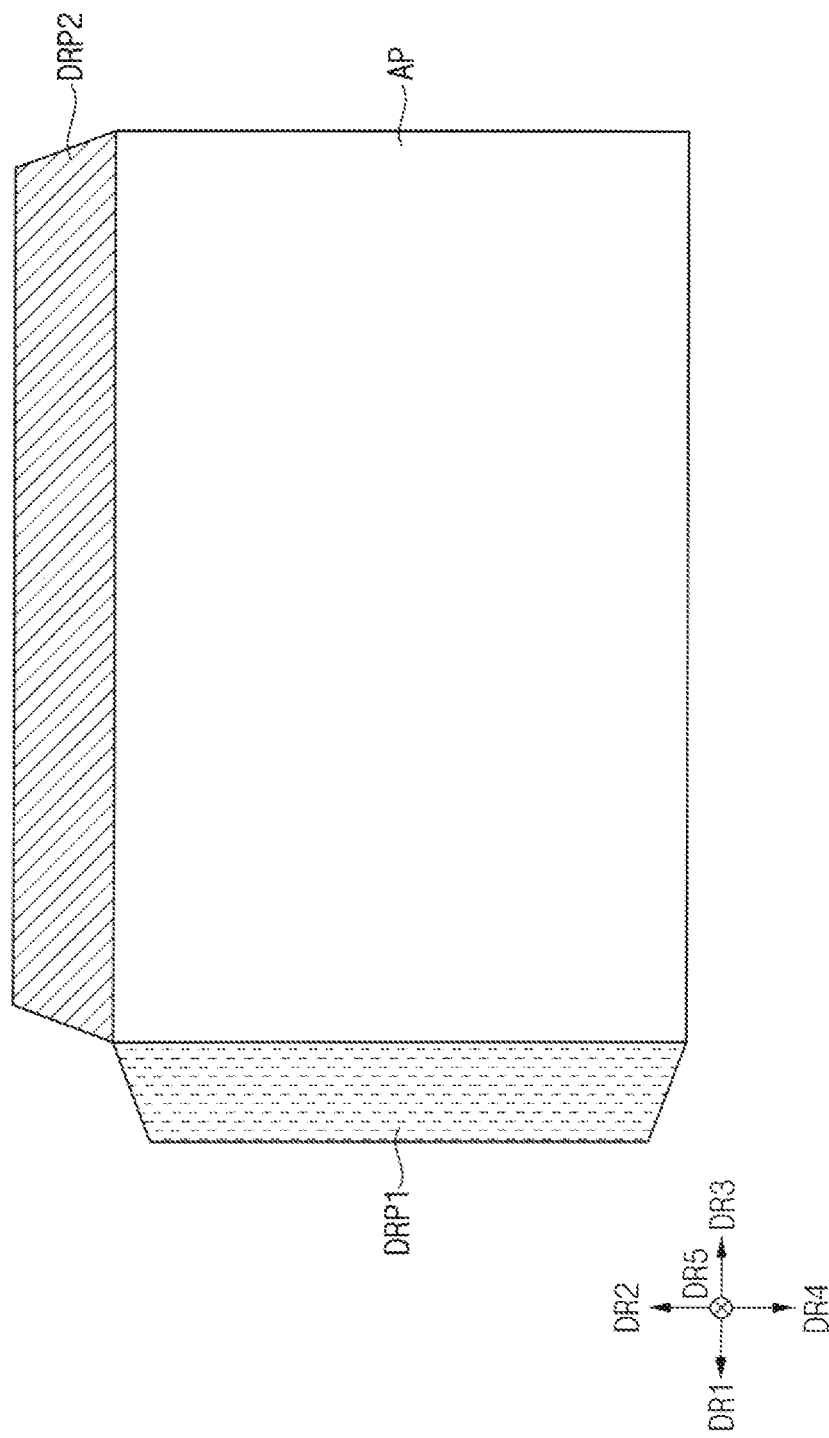
FIG. 2 is a plan view illustrating some embodiments of a display panel included in the display device of FIG. 1.

FIG. 2 is a plan view illustrating some embodiments of a display panel included in the display device of FIG. 1.

Referring to FIGS. 1 and 2, the display panel DP may include one active panel AP. The active panel AP may include the pixels and the light emitting elements. The pixels and the light emitting elements may be arranged in various ways in the active panel AP to display an image. For example, the pixels and the light emitting elements may be arranged in a matrix form on the active panel AP.

A first driving panel DRP1 may be arranged in the first direction DR1 from the active panel AP. The first driving panel DRP1 may be coupled to the active panel AP by a separate connection member. For example, the connection member may include an anisotropic conductive film, a connector, or a solder joint. However, this list is an example only and the type of the connection member connecting or coupling the first driving panel DRP1 and the active panel AP is not limited thereto.

A second driving panel DRP2 may be arranged in the second direction DR2 from the active panel AP. The second direction DR2 may be perpendicular to the first direction DR1. The second driving panel DRP2 may be coupled to the active panel AP by the connection member.

In some embodiments, the first driving panel DRP1 and the second driving panel DRP2 may be coupled to the active panel AP by the same type of connecting member, or by different types of connecting members. For example, both of the first driving panel DRP1 and the second driving panel DRP2 may be coupled to the active panel AP by an anisotropic conductive film. Alternatively, the first driving panel DRP1 may be coupled to the active panel AP by an anisotropic conductive film, and the second driving panel DRP2 may be coupled to the active panel AP by a connector.

In some embodiments, the first driving panel DRP1 may correspond to the gate driver GDV transmitting a gate signal, and the second driving panel DRP2 may correspond to the data driver DDV transmitting a data signal. However, this is an example only and the first driving panel DRP1 may correspond to the data driving part DDV, and the second driving panel DRP2 may correspond to the gate driving part GDV.

Accordingly, the active panel AP, the first driving panel DRP1, and the second driving panel DRP2 may be manufactured separately and then coupled to operate as a single display panel.

Figure 3:
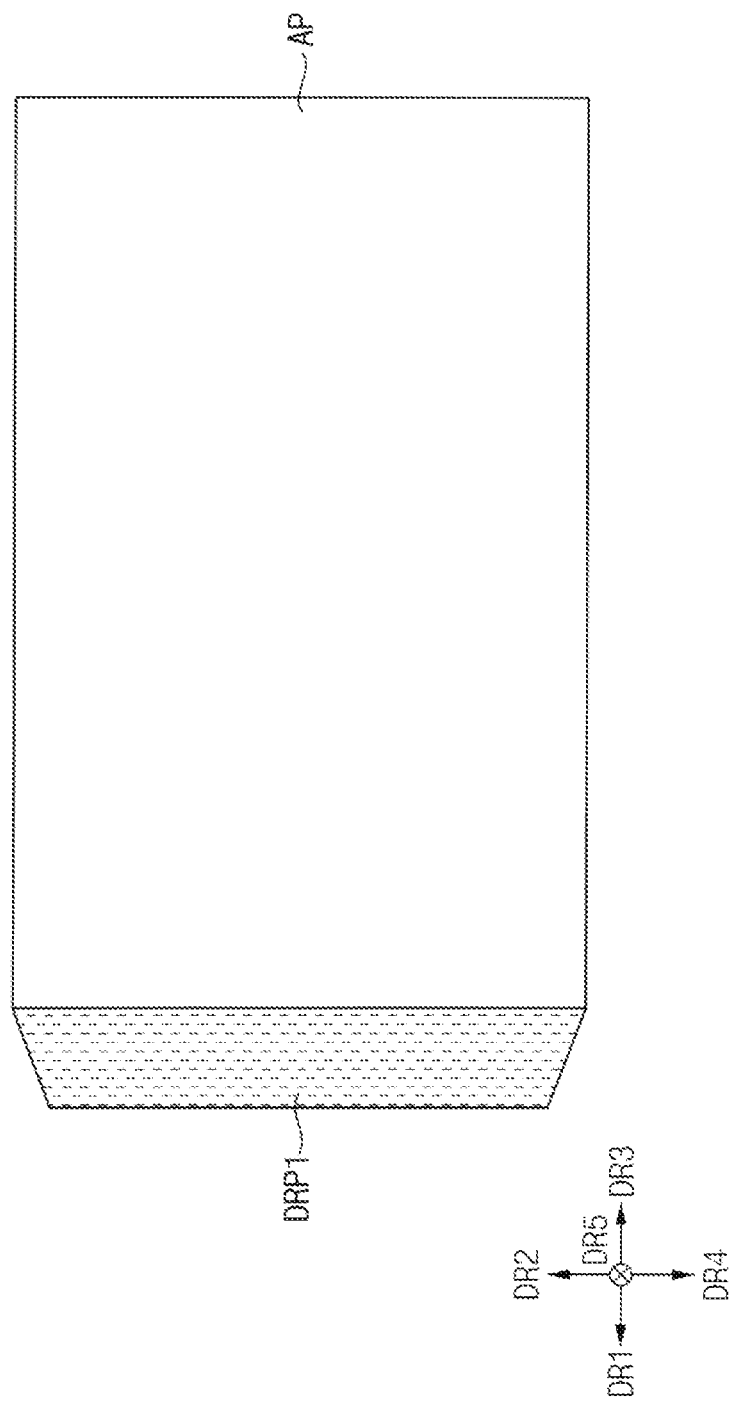
FIG. 3 is a plan view illustrating some embodiments of a display panel included in the display device of FIG. 1.

FIG. 3 is a plan view illustrating some embodiments of a display panel included in the display device of FIG. 1.

Referring to FIGS. 1 and 3, in some embodiments, the driving panel may be coupled to only one side of the active panel AP. For example, the first driving panel DRP1 may be coupled only in the first direction DR1 from the active panel AP. In this case, the first driving panel DRP1 may be a driving panel that provides both a gate signal and a data signal to the active panel AP. Accordingly, when the driving panel is arranged only on one side of the active panel AP, a bezel area of the display device may be reduced.

Figure 4:
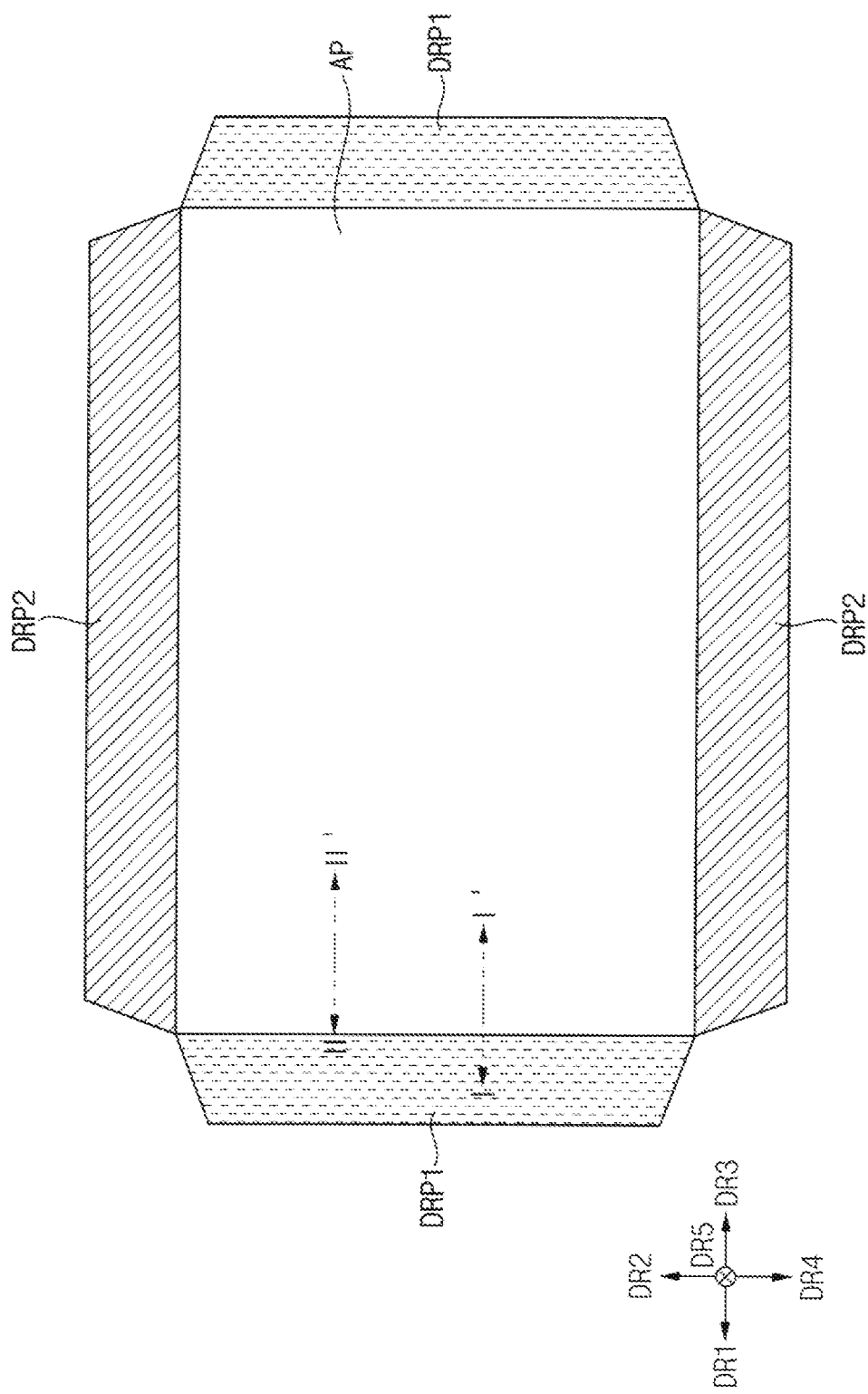
FIG. 4 is a plan view illustrating some embodiments of a display panel included in the display device of FIG. 1.

FIG. 4 is a plan view illustrating some embodiments of a display panel included in the display device of FIG. 1.

Referring to FIGS. 1 and 4, driving panels may be coupled to both sides (e.g., on all four sides) of the active panel AP. In some embodiments, the first driving panels DRP1 may be arranged in the first direction DR1 and a third direction DR3 from the active panel AP. The third direction DR3 may be a direction opposite to the first direction DR1. In addition, the second driving panels DRP2 may be arranged in the second direction DR2 and a fourth direction DR4 from the active panel AP. The fourth direction DR4 may be a direction opposite to the second direction DR2.

In some embodiments, the first driving panels DRP1 may provide a gate signal to the active panel AP, and the second driving panels DRP2 may provide a data signal to the active panel AP. Alternatively, the first driving panels DRP1 may provide a data signal to the active panel AP, and the second driving panels DRP2 may provide a gate signal to the active panel AP.

In some embodiments, the first and second driving panels DRP1, DPR2 may be respectively coupled to the active panel AP by the connection member. As described above, the first and second driving panels DRP1, DRP2 may be coupled to the active panel AP by the same type of connection member, or by different types of connection members.

Figure 5A:
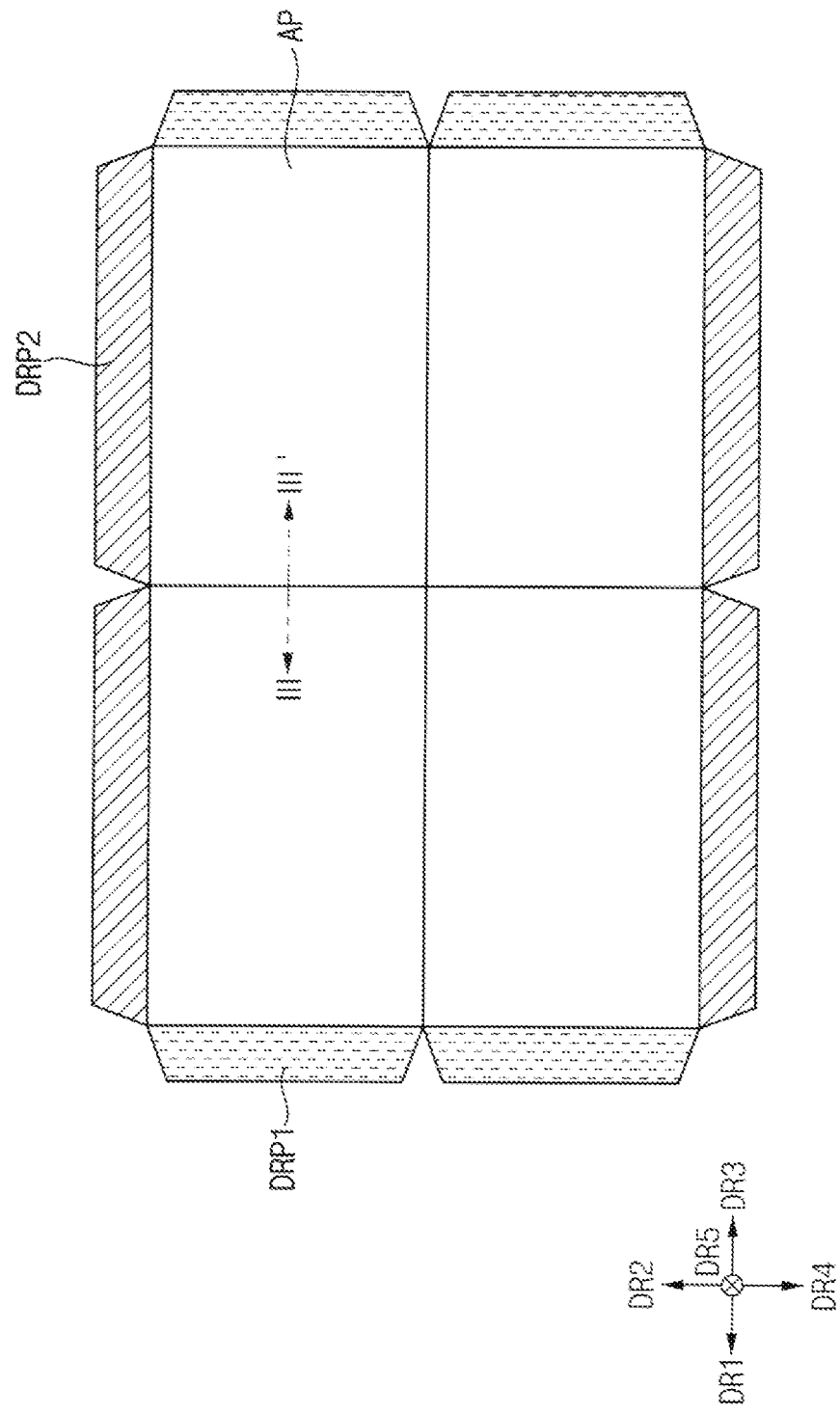
FIGS. 5A and 5B are plan views illustrating some embodiments of a display panel included in the display device of FIG. 1.
Figure 5B:
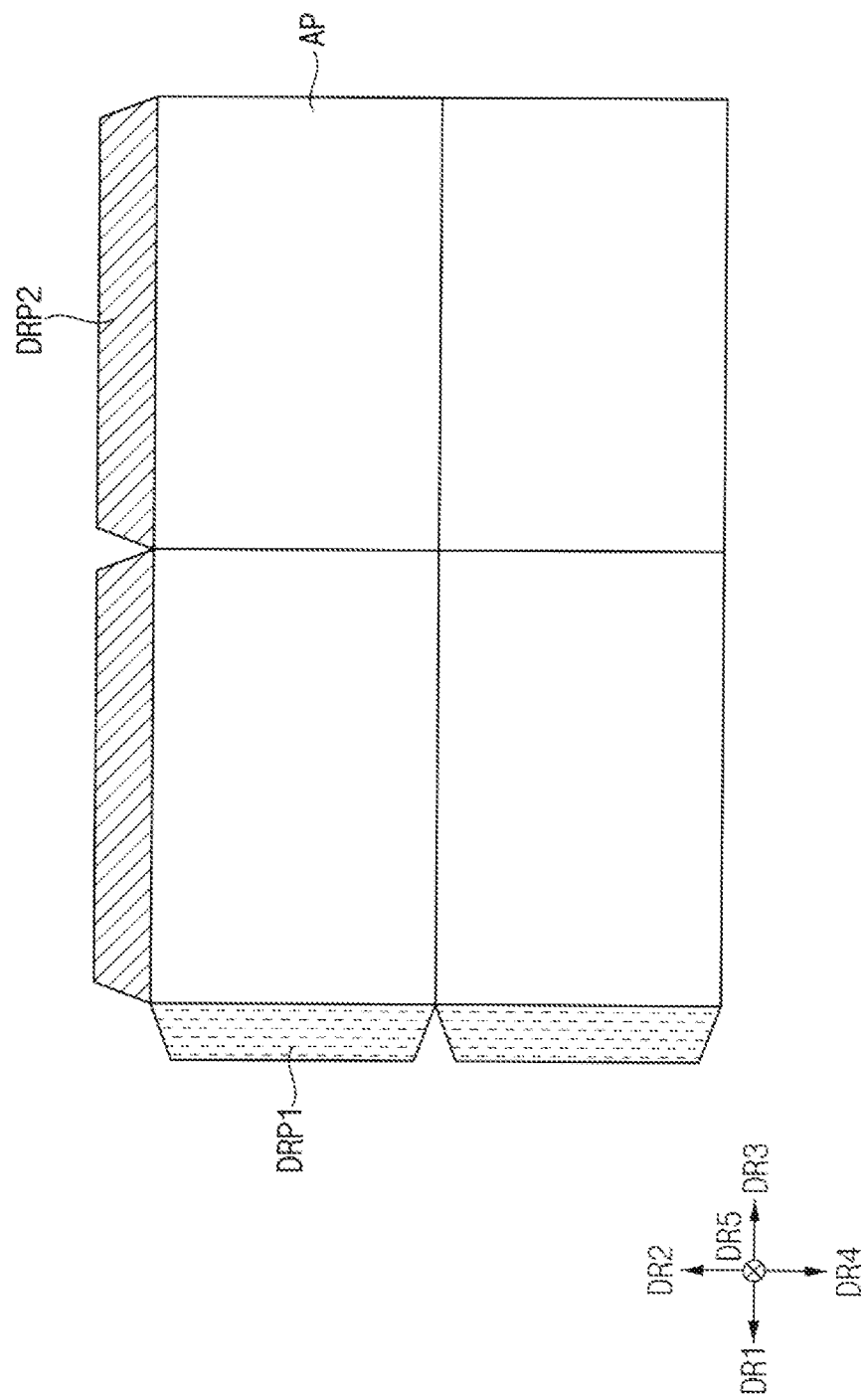

FIGS. 5A and 5B are plan views illustrating some embodiments of a display panel included in the display device of FIG. 1.

Referring to FIGS. 1 and 5A, the display panel may include a plurality of active panels AP. The active panels AP may be coupled to each other to operate as a single display panel. In this case, the display device may be defined as a tiled display device. Each of the active panels AP may be coupled to each other by the connection member. In some embodiments, the active panels AP may be coupled to each other by the same type of connecting member or by different types of connecting members.

In some embodiments, the first driving panel DRP1 and the second driving panel DRP2 may be coupled to each of the active panels AP. Through the first driving panel DRP1 and the second driving panel DRP2, a gate signal and a data signal may be divided and provided to each of the active panels AP.

Further, referring to FIG. 5B, in some embodiments, the first driving panels DRP1 and/or the second driving panels DRP2 may be coupled only in one direction of the coupled active panels AP. For example, the first driving panels DRP1 may be coupled in the first direction DR1 of the coupled active panels AP, and the second driving panels DRP2 may be coupled in the second direction DR2 of the coupled active panels AP.

Figure 6A:
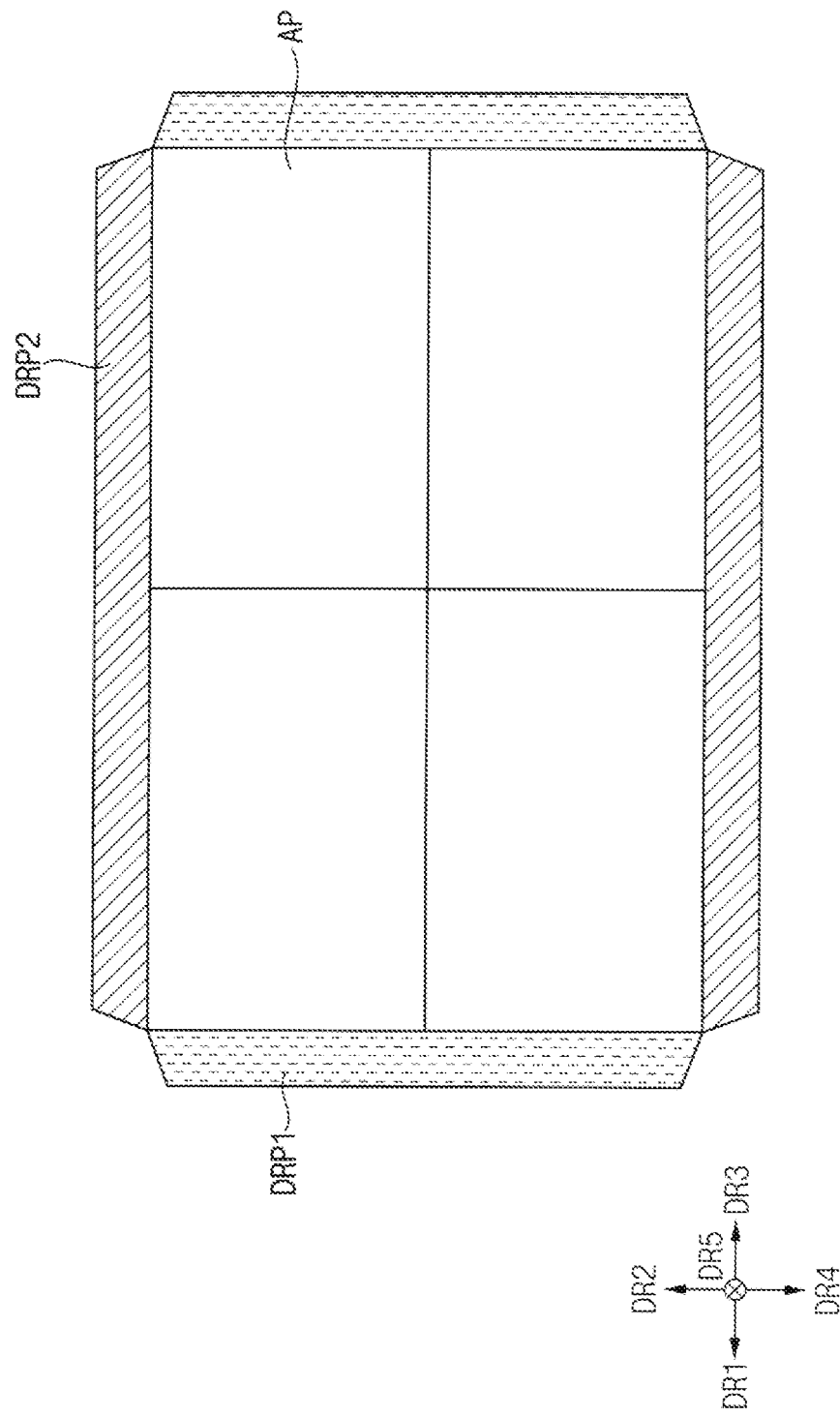
FIGS. 6A and 6B are plan views illustrating some embodiments of a display panel included in the display device of FIG. 1.
Figure 6B:
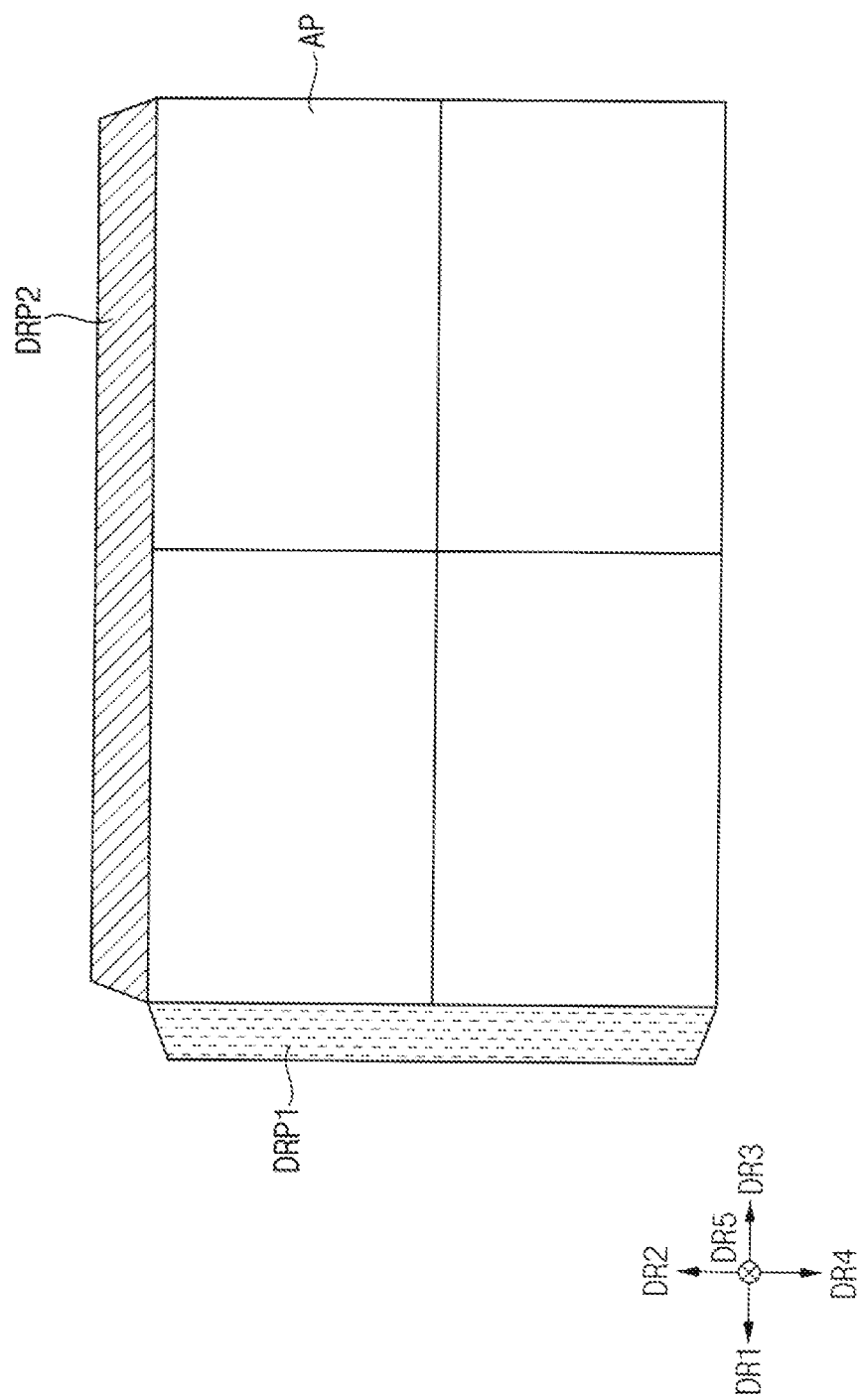

FIGS. 6A and 6B are plan views illustrating some embodiments of a display panel included in the display device of FIG. 1.

Referring to FIGS. 1, 6A and 6B, in some embodiments, one first driving panel DRP1 and one second driving panel DRP2 may be coupled to each of the two active panels AP. However, this is an example only, and one first driving panel DRP1 may be coupled to every p active panels AP, and one second driving panel DRP2 may be coupled to every q active panels AP, where the sum of p and q are natural numbers equal to or greater than 3. For example, the first driving panel DRP1 may be coupled to each of the three active panels AP, and the second driving panel DRP2 may be coupled to each of the two active panels AP.

In some embodiments, the first or second driving panels DRP1, DRP2 may be coupled to only one side of the active panels AP (e.g., FIG. 6B), or may be coupled to both sides of the active panels AP (e.g., FIG. 6A).

FIGS. 7A and 7B are plan views illustrating some embodiments of a display panel included in the display device of FIG. 1.

Referring to FIGS. 1, 7A and 7B, the display panel DP may include a plurality of active panels AP. In some embodiments, the active panels AP may be arranged in a matrix form. For example, the active panels AP may be arranged in the form of an M×N matrix, where M and N are natural numbers equal to or greater than 3. A size of the display panel DP may be determined according to the number of the active panels AP coupled to each other. Accordingly, the more active panels AP there are coupled together, the larger the size of the display panel DP. In some embodiments, display panels DP of various sizes can easily be manufactured according to manufacturing processes for active panels AP having a size (e.g., a set or predetermined size).

In embodiments, the first driving panel DRP1 or the second driving panel DRP2 may be coupled to only one side of the active panels AP (e.g., FIG. 7B), or may be coupled to both sides of the active panels (e.g., FIG. 7A).

FIGS. 8 to 11 are diagrams schematically illustrating some embodiments in which an active panel and a driving panel are coupled. FIGS. 8 to 11 shows an example of a cross-sectional view cut in line I-I' of FIG. 4. In some embodiments, a cross-sectional view cut in the second direction DR2 may have substantially the same structure as the cross-sectional view cut in line I-I' of FIG. 4.

Referring to FIGS. 8 to 11, the active panel AP may be bonded to a first support substrate SS1, according to some embodiments. The active panel AP may include a display area DA and a non-display area surrounding the display area DA. The non-display area may include an adjacent area AA adjacent to the display area DA and a bending area CA spaced apart from the display area DA by the adjacent area AA. The display area DA may be bonded to an upper surface of the first support substrate SS1, and the bending area CA may be bonded to a side surface coupled to the upper surface of the first support substrate SS1.

In some embodiments, the first driving panel DRP1 may be bonded to a second support substrate SS2. The first driving panel DRP1 may be bonded to an upper surface of the second support substrate SS2 and a side surface coupled to the upper surface. That is, the first driving panel DRP1 may be bonded to the second support substrate SS2 while being folded (e.g., in a folded manner).

In some embodiments, the second driving panel DRP2 may be bonded to a third support substrate SS3. The second driving panel DRP2 may be bonded to an upper surface of the third support substrate SS3 and a side surface coupled to the upper surface. That is, the second driving panel DRP2 may be bonded to the third support substrate SS3 while being folded (e.g., in a folded manner).

In some embodiments, the first and second driving panels DRP1, DRP2 may be coupled to the active panel AP by a connection member CM, respectively. The connection member CM may be coupled to lines on the first driving panel DRP1 and lines on the active panel AP. In addition, the connection member CM may be coupled to lines on the second driving panel DRP2 and lines on the active panel AP. That is, the first and second driving panels DRP1, DRP2 may provide signals to the active panel AP through the connection member CM. In some embodiments, the connection member CM may include an anisotropic conductive film, a connector, or a solder joint.

In some embodiments, the first to third support substrates SS1, SS2, SS3 may be rigid substrates. In this case, the first to third support substrates SS1, SS2, SS3 may include glass. Alternatively, in some embodiments, the first to third support substrates SS1, SS2, SS3 may be flexible substrates. In this case, the first to third support substrates SS1, SS2, SS3 may include plastic (e.g., polyimide).

Figure 12:
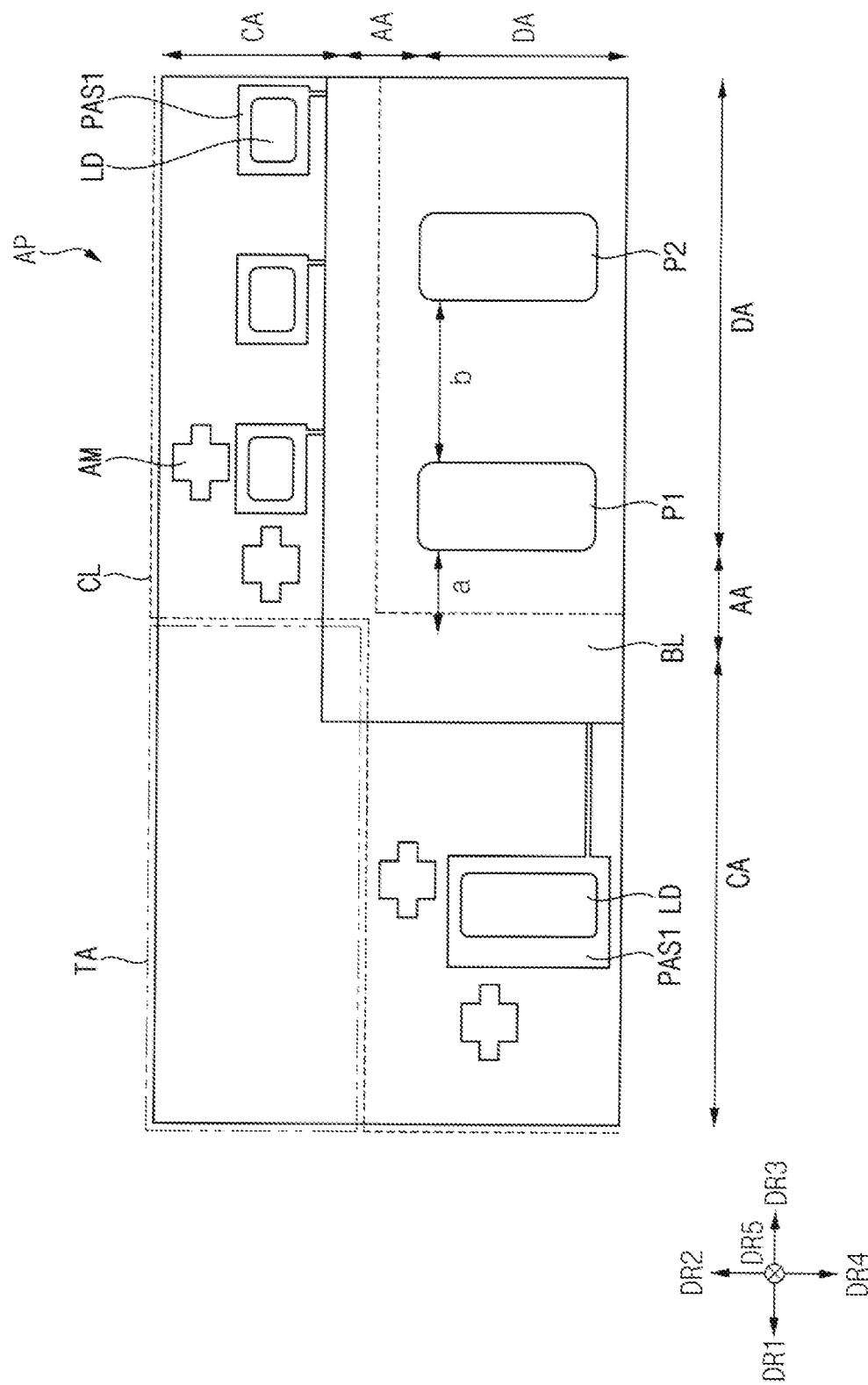
FIG. 12 is a plan view illustrating some embodiments of an active panel included in the display device of FIG. 1.
Figure 13:
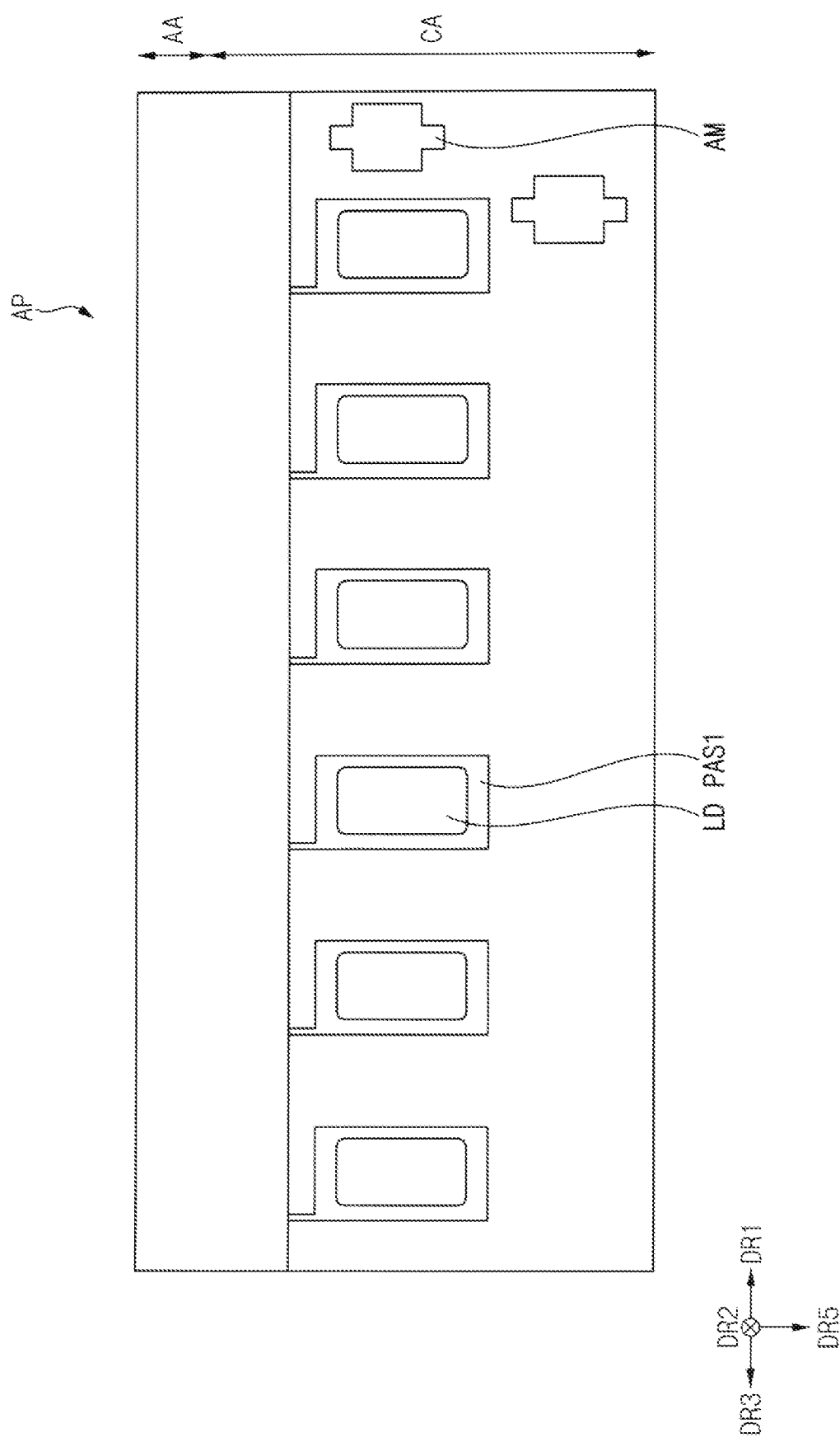
FIG. 13 is a diagram illustrating some embodiments of a bending area of the active panel of FIG. 12.

FIG. 12 is a plan view illustrating some embodiments of an active panel included in the display device of FIG. 1, and FIG. 13 is a diagram illustrating some embodiments of a bending area of the active panel of FIG. 12.

Referring to FIGS. 1, 12 and 13, the active panel AP may constitute the display panel DP. Alternatively, in some embodiments, the active panels AP may be coupled to each other to form the display panel DP. The active panel AP may include a display area DA, an adjacent area AA, and a bending area CA. The active panel AP may be cut along the cutting line CL to be bent. The cut area TA may be removed. Thereafter, the active panel AP may be bent along the bending line BL. For example, FIG. 12 is a view showing the active panel AP described with reference to FIGS. 8 to 11 in an unfolded state. Each of the areas of FIG. 12 may correspond to the areas described with reference to FIGS. 8 to 11.

In some embodiments, a connection electrode LD may be exposed in the bending area CA. A first protective layer PAS1 may be arranged to cover a part of the connection electrode LD. The active panel AP may be coupled to the aforementioned driving panels through the connection electrode LD. In more detail, the above-described connection member may be coupled to the connection electrode LD and the driving panels.

In some embodiments, an alignment mark AM may be formed in the bending area CA. Due to the alignment mark AM, the active panel AP and the above-described driving panel may be precisely coupled together. In addition, the active panels AP may be precisely coupled to each other due to the alignment mark AM.

In some embodiments, a plurality of pixels may be arranged in the display area DA. For example, the first pixel P1 and the second pixel P2 may be arranged in the display area DA. A first width a of the adjacent area AA may be less than half of a second width b between the first pixel P1 and the second pixel P2. In this case, when the active panel AP is coupled to another active panel AP, a seam-line visually recognized when the active panels AP are coupled may not be visually recognized. In other words, a seam-line that would otherwise be visible may appear to be invisible.

In some embodiments, the bending area CA of the active panel AP may be bent in a fifth direction DR5 perpendicular to the first and second directions DR1 and DR2. In some embodiments, the active panel AP may include four bending areas CA perpendicular to the display area DA. In other words, the bending areas CA may be perpendicular to a plane formed by the display area in the first and second directions DR1 and DR2. However, when the active panel AP is a polygon, the active panel AP may include bending areas CA corresponding to the number of sides of the polygon.

Figure 14:
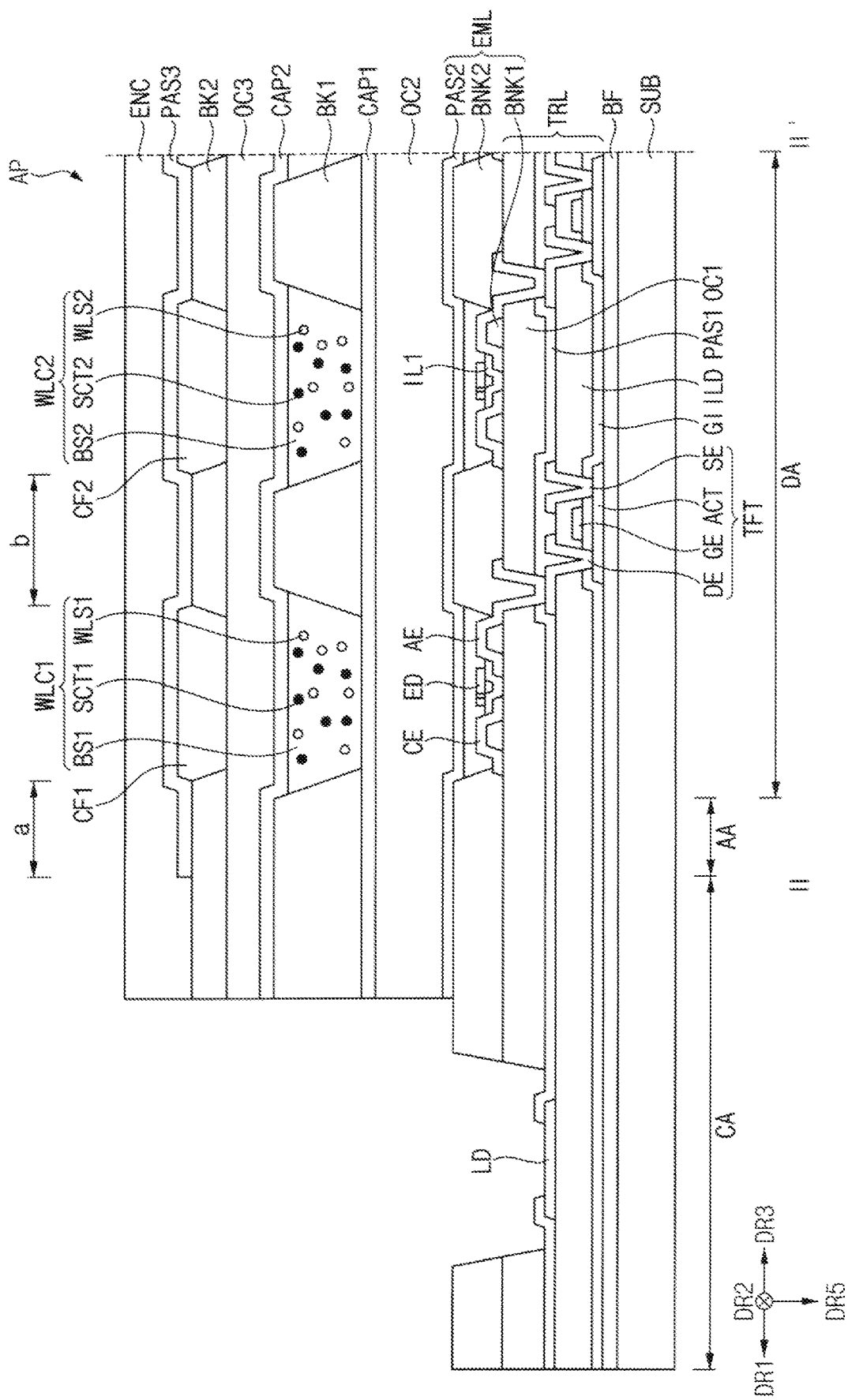
FIG. 14 is a cross-sectional view illustrating some embodiments taken along the line II-II' of FIG. 4.

FIG. 14 is a cross-sectional view illustrating some embodiments taken along the line II-II' of FIG. 4.

Referring to FIGS. 4 and 14, a substrate SUB may include a transparent or opaque material. For example, the substrate SUB may include glass, quartz, plastic, or the like.

In some embodiments, a buffer layer BF may be on the substrate SUB. The buffer layer BF may be formed of an inorganic film capable of reducing (e.g., preventing) penetration of air or moisture.

In some embodiments, a transistor layer TRL may be on the substrate SUB. At least one transistor TFT may be formed in the transistor layer TRL. The transistor TFT may include a switching transistor configured to be turned on according to the gate signal, a driving transistor generating a driving current based on the data voltage, and a light emitting transistor transmitting the driving current to an anode electrode.

In some embodiments, a semiconductor layer ACT may be on the buffer layer BF. The semiconductor layer ACT may overlap a gate electrode GE, a source electrode SE, and a drain electrode DE. The semiconductor layer ACT may directly contact the source electrode SE and the drain electrode DE, and may face the gate electrode GE with a gate insulating layer GI interposed therebetween.

In some embodiments, the gate electrode GE may be on the gate insulating layer GI. The gate electrode GE may overlap the semiconductor layer ACT with the gate insulating layer GI interposed therebetween.

In some embodiments, the source electrode SE and the drain electrode DE may be spaced apart from each other on an interlayer insulating layer ILD. The source electrode SE may contact one end of the semiconductor layer ACT through a contact hole provided in the gate insulating layer GI and the interlayer insulating layer ILD. The drain electrode DE may contact the other end of the semiconductor layer ACT through a contact hole provided in the gate insulating layer GI and the interlayer insulating layer ILD. The drain electrode DE may be coupled to the first electrode AE of the light emitting member EL through a contact hole provided in the first protective layer PAS1 and the first planarization layer OC1.

In some embodiments, the gate insulating layer GI may be on the semiconductor layer ACT. For example, the gate insulating layer GI may be arranged on the semiconductor layer ACT and the buffer layer BF, and may insulate the semiconductor layer ACT and the gate electrode GE. The gate insulating layer GI may include a contact hole through which the source electrode SE passes and a contact hole through which the drain electrode DE passes.

In some embodiments, the interlayer insulating layer ILD may be on the gate electrode GE. For example, the interlayer insulating layer ILD may include a contact hole through which the source electrode SE passes and a contact hole through which the drain electrode DE passes.

In some embodiments, the first protective layer PAS1 may be on a transistor TFT and may protect the transistor TFT. For example, the first protective layer PAS1 may include a contact hole through which the first electrode AE passes.

In some embodiments, the first planarization layer OC1 may be on the first protective layer PAS1 and may planarize an upper end of the transistor TFT. For example, the first planarization layer OC1 may include a contact hole through which the first electrode AE of the light emitting member EL passes.

In some embodiments, the light emitting element layer EML may include the light emitting member EL, a first bank BNK1, a second bank BNK2, and a second protective layer PAS2.

In some embodiments, the light emitting member EL may be on the transistor TFT. The light emitting member EL may include the first electrode AE, a second electrode CE, and a light emitting diode ED.

In some embodiments, the first electrode AE may be on the first planarization layer OC1. For example, the first electrode AE may be on the first bank BNK1, which is on the first planarization layer OC1 and may cover the first bank BNK1. The first electrode AE may be coupled to the drain electrode DE of the transistor TFT.

In some embodiments, the second electrode CE may be on the first planarization layer OC1. For example, the second electrode CE may be on the first bank BNK1, which is on the first planarization layer OC1 and may cover the first bank BNK1. The second electrode CE may receive a common voltage supplied to the pixel.

In some embodiments, a first insulating layer IL1 may cover a part of the first electrode AE and a part of the second electrode CE adjacent to each other, and may insulate the first electrode AE and the second electrode CE.

In some embodiments, the light emitting diode ED may be between the first electrode AE and the second electrode CE above the first planarization layer OC1. In some embodiments, the light emitting diode ED may be on the first insulating layer IL1.

One end of the light emitting diode ED may be coupled to the first electrode AE, and the other end of the light emitting diode ED may be coupled to the second electrode CE. For example, the light emitting diode ED may include an active layer having the same material and emit light of the same wavelength band or light of the same color. In one example, the light emitting diode ED may emit blue light having a peak wavelength in the range of 440 nm to 480 nm.

In some embodiments, the light emitting diode ED may be an inorganic light emitting diode containing an inorganic material. For example, the inorganic light emitting diode may include gallium nitrate ("GaN") and/or other inorganic material known in the art.

Alternatively, in some embodiments, the light emitting diode ED may be an organic light emitting diode. The organic light emitting diode may emit light through recombination of holes and electrons.

In some embodiments, a second bank BNK2 may be on the first planarization layer OC1 to define a light emitting area. For example, the second bank BNK2 may surround the light emitting area, but is not limited thereto.

In some embodiments, a second protective layer PAS2 may be on the light emitting member EL and the second bank BNK2. The second protective layer PAS2 may cover the light emitting member EL and may protect the light emitting member EL.

In some embodiments, a second planarization layer OC2 may be provided on the light emitting element layer EML to planarize the top of the light emitting element layer EML. The second planarization layer OC2 may include an organic material.

In some embodiments, the first capping layer CAP1 may be on the second planarization layer OC2. The first capping layer CAP1 may seal the lower surfaces of first and second wavelength converters WLC1 and WLC2. The first capping layer CAP1 may include an inorganic material.

In some embodiments, a first light blocking member BK1 may be on the first capping layer CAP1. The first light blocking member BK1 may overlap the second bank BNK2 in a thickness direction. In other words, the first light blocking member BK1 may be aligned with the second bank BNK2 in the fifth direction DR5. The first light blocking member BK1 may block transmission of light. The first light blocking member BK1 may include an organic light blocking material and a liquid repellent component.

In some embodiments, a first wavelength converter WLC1 may be on the first capping layer CAP1. The first wavelength converter WLC1 may overlap the light emitting diode ED. The first wavelength converter WLC1 may be surrounded by the first light blocking member BK1. The first wavelength converter WLC1 may include a first base resin BS1, a first scatter body SCT1, and a first wavelength shifter WLS1.

In some embodiments, the first base resin BS1 may include a material having a relatively high light transmittance. The first base resin BS1 may be made of a transparent organic material. For example, the first base resin BS1 may include at least one of organic materials such as an epoxy resin, an acrylic resin, a cardo resin, and/or an imide resin.

In some embodiments, the first scattering body SCT1 may have a refractive index different from that of the first base resin BS1, and may form an optical interface with the first base resin BS1.

In some embodiments, the first wavelength shifter WLS1 may convert or shift a peak wavelength of incident light to a first peak wavelength. For example, the first wavelength shifter WLS1 may convert blue light into green light having a single peak wavelength ranging from about 510 nm to about 550 nm and then emit the green light.

The first wavelength shifter WLS1 may be a quantum dot, a quantum rod, or a phosphor. The quantum dot may be a particulate material that emits a specific color while electrons transition from a conduction band to a valence band.

The light emitted by the first wavelength shifter WLS1 may have a full width of an emitting wavelength spectrum (e.g., Full Width of Half Maximum ("FWHM")) of about 45 nm or less, or about 40 nm or less, or about 30 nm or less. Accordingly, color reproducibility of the tiled display device may be improved.

In some embodiments, some of the blue light provided from the light emitting element layer EML may pass through the first wavelength converter WLC1 without being converted into green light by the first wavelength shifter WLS1. Among the blue light provided by the light emitting element layer EML, the light that is not converted by the first wavelength converter WLC1 and incident on the first color filter CF1 may be blocked by the first color filter CF1. However, the blue light that is converted by the first wavelength converter WLC1 into green light may pass through the first color filter CF1 and may be emitted to the outside.

In some embodiments, a second wavelength converter WLC2 may be located on the first capping layer CAP1. The second wavelength converter WLC2 may overlap the light emitting diode ED. The second wavelength converter WLC2 may be surrounded by the first light blocking member BK1. The second wavelength converter WLC2 may include a second base resin BS2, a second scattering body SCT2, and a second wavelength shifter WLS2.

The second base resin BS2 may include a material having a relatively high light transmittance. The second base resin BS2 may be made of a transparent organic material.

In some embodiments, the second scattering body SCT2 may have a refractive index different from that of the second base resin BS2, and may form an optical interface with the second base resin BS2. For example, the second scattering body SCT2 may include a light scattering material or light scattering particles that scatter at least a part of the transmitted light.

In some embodiments, the second wavelength shifter WLS2 may convert or shift the peak wavelength of incident light into a second peak wavelength different from the first peak wavelength of the first wavelength shifter WLS1. For example, the second wavelength shifter WLS2 may convert blue light into red light having a single peak wavelength in the range of about 610 nm to about 650 nm and then emit the red light. The second wavelength shifter WLS2 may be a quantum dot, a quantum rod, or a phosphor. The second wavelength shifter WLS2 may include a material having the same effect as the material exemplified in the first wavelength shifter WLS1.

In some embodiments, the light transmitting part may be on the first capping layer CAP1. The light transmitting part may overlap the light emitting diode ED. The light transmitting part may be surrounded by the first light blocking member BK1. The light transmitting part may transmit the incident light by maintaining a peak wavelength. The light transmitting part may include a third base resin and a third scattering body.

The third base resin may include a material having a relatively high light transmittance. The third base resin may be made of a transparent organic material.

In some embodiments, the third scattering body may have a refractive index different from that of the third base resin, and may form an optical interface with the third base resin. For example, the third scattering body may include a light scattering material or light scattering particles that scatter at least a portion of the transmitted light.

In some embodiments, the first and second wavelength converters WLC1, WLC2 and the light transmitting part may be located on the light emitting element layer EML through the second planarization layer OC2 and the first capping layer CAP1. Accordingly, the tiled display device may not include a separate substrate for the first and second wavelength converters WLC1, WLC2 and the light transmitting part.

The second capping layer CAP2 may cover the first and second wavelength converters WLC1, WLC2, the light transmitting part, and the first light blocking member BK1.

In some embodiments, the third planarization layer OC3 may be on the second capping layer CAP2 to planarize the first and second wavelength converters WLC1, WLC2 and upper ends of the light transmitting part. The third planarization layer OC3 may include an organic material.

In some embodiments, the second light blocking member BK2 may be on the third planarization layer OC3. The second light blocking member BK2 may overlap the first light blocking member BK1 and/or the second bank BNK2 in a thickness direction. In other words, the second light blocking member BK2 may be aligned with the first light blocking member BK1 and/or the second bank BNK2 in the fifth direction DR5. The second light blocking member BK2 may block transmission of light.

In some embodiments, the first color filter CF1 may be on the third planarization layer OC3. The first color filter CF1 may be surrounded by the second light blocking member BK2. The first color filter CF1 may overlap the first wavelength converter WLC1 in a thickness direction (e.g., in the fifth direction DR5). The first color filter CF1 may selectively transmit light of a first color (e.g., green light), and may block or absorb light of the second color (e.g., red light) and light of a third color (e.g., blue light).

In some embodiments, the second color filter CF2 may be on the third planarization layer OC3. The second color filter CF2 may be surrounded by the second light blocking member BK2. The second color filter CF2 may overlap the second wavelength converter WLC2 in a thickness direction (e.g., in the fifth direction DR5).

The second color filter CF2 may selectively transmit light of a second color (e.g., red light), and may block or absorb light of a first color (e.g., green light) and light of a third color (e.g., blue light).

In some embodiments, a third color filter may be on the third planarization layer OC3. The third color filter may be surrounded by the second light blocking member BK2. The third color filter may overlap the light transmitting part in a thickness direction (e.g., the fifth direction DR5). The third color filter may selectively transmit light of a third color (e.g., blue light), and may block or absorb light of a first color (e.g., green light) and light of a second color (e.g., red light).

In some embodiments, a third passivation layer PAS3 may cover the first color filter CF1, the second color filter CF2, and the third color filter. The third passivation layer PAS3 may protect the first color filter CF1, the second color filter CF2, and the third color filter.

In some embodiments, an encapsulation layer ENC may be on the third passivation layer PAS3. For example, the encapsulation layer ENC may include at least one inorganic layer to reduce or prevent penetration of oxygen or moisture. In addition, the encapsulation layer ENC may further include at least one organic layer.

In some embodiments, the bending area CA may include an opening exposing the connection electrode LD. The connection electrode LD may be on the interlayer insulating layer ILD. In some embodiments, the connection electrode LD may be formed of the same material on the same layer as the source electrode SE and the drain electrode DE. The side part of the connection electrode LD may be covered by the first protective layer PAS1. The above-described connection member may contact the connection electrode LD. Accordingly, the above-described driving panels may transmit a signal (e.g., a gate signal, a data signal, etc.) to the transistor TFT through the connection electrode LD.

In this way, the bending area CA of the active panel AP may be bent in the fifth direction DR5 and may be coupled to the driving panels through the openings. Accordingly, individual panels may be manufactured and assembled, according to the embodiments of the present disclosure, and a single display device may be easily manufactured. In addition, a seam-line may not be visually recognized by minimizing the width of an area to which the active panels AP are coupled, according to the embodiments of the present disclosure.

Figure 15:
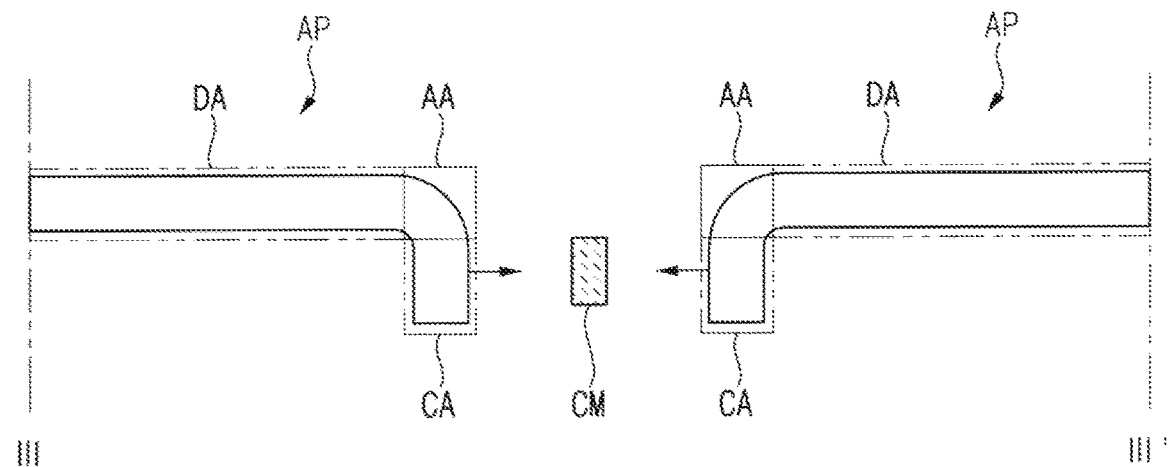
FIGS. 15 and 16 are diagrams illustrating some embodiments taken along the line III-III' of FIG. 5A.
Figure 16:
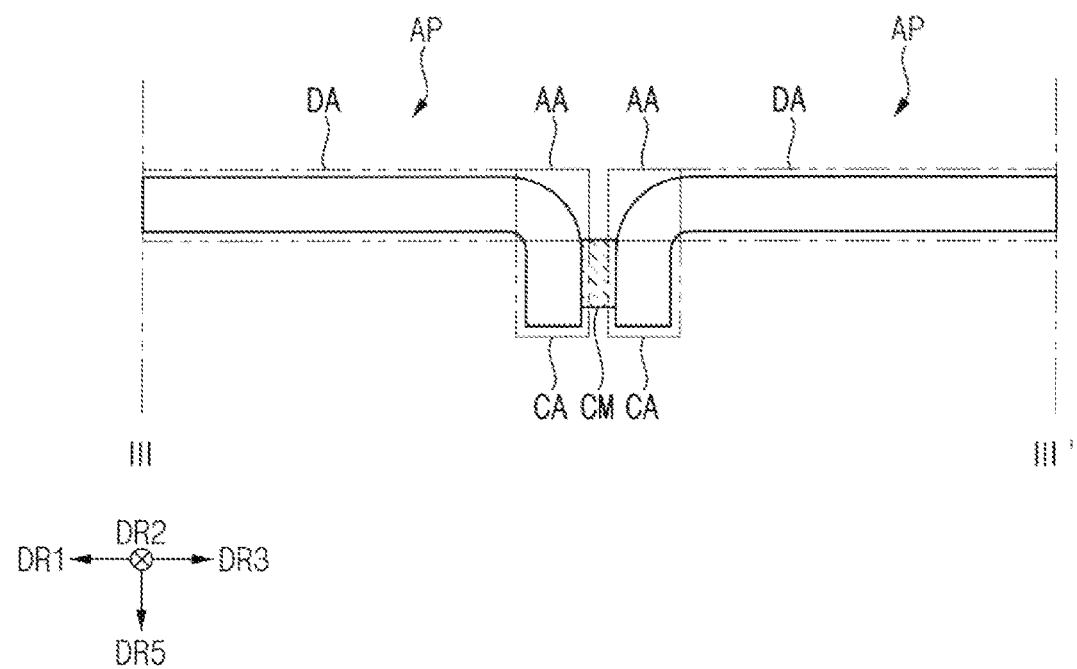

FIGS. 15 and 16 are diagrams illustrating some embodiments taken along the line III-III' of FIG. 5A.

Referring to FIGS. 15 and 16, the active panels AP may be coupled to each other. For example, the active panels AP may be electrically coupled to each other by the connection member CM, and signals (e.g., gate signals, data signals, etc.) may be exchanged between the active panels AP through the connection member CM.

FIGS. 15 and 16 illustrate an example structure which does not include the support substrate for illustrative purposes and is not limited thereto. In some embodiments, the aforementioned support substrate may be located under the active panels of FIGS. 15 and 16.

FIGS. 17 to 23 are diagrams illustrating display panels according to some embodiments.

Referring to FIG. 17, the display device may include a first active panel DS1. In some embodiments, the first active panel DS1 may include an active area ACA, a data fan-out area DFA, a gate fan-out area GFA, a gate transfer area GSA, and a data transfer area DSA. A plurality of pixels P may be located in the active area ACA. A data signal may be transmitted from the data fan-out area DFA to the active area ACA, and a gate signal may be transmitted from the gate fan-out area GFA to the active area ACA.

In some embodiments, a gate fan-out line GFL may be in the gate fan-out area GFA. The gate fan-out line GFL may be coupled to a gate line GL in the active area ACA. The gate line GL may extend to the gate transfer area GSA. A data fan-out line DFL may be in the data fan-out area DFA. The data fan-out line DFL may be coupled to a data line DL in the active area ACA. The data line DL may extend to the data transfer area DSA. The gate line GL and the data line DL may be coupled to the pixels P. The gate line GL may provide a gate signal to the pixels P, and the data line DL may provide a data signal to the pixels P. Accordingly, the pixels P may display an image based on the signals.

In some embodiments, the gate fan-out area GFA may be positioned in the first direction DR1 from the active area ACA. The data fan-out area DFA may be positioned in the second direction DR2 from the active area ACA. The gate transfer area GSA may be positioned in the third direction DR3 from the active region ACA. The data transfer area DSA may be positioned in the fourth direction DR4 from the active area ACA. The gate transfer area GSA and the data transfer area DSA may be bent in the fifth direction DR5 perpendicular to the first direction DR1 and the second direction DR2. Each of the gate transfer area GSA and the data transfer area DSA may be coupled to another display panel by a connection member.

Figure 18:
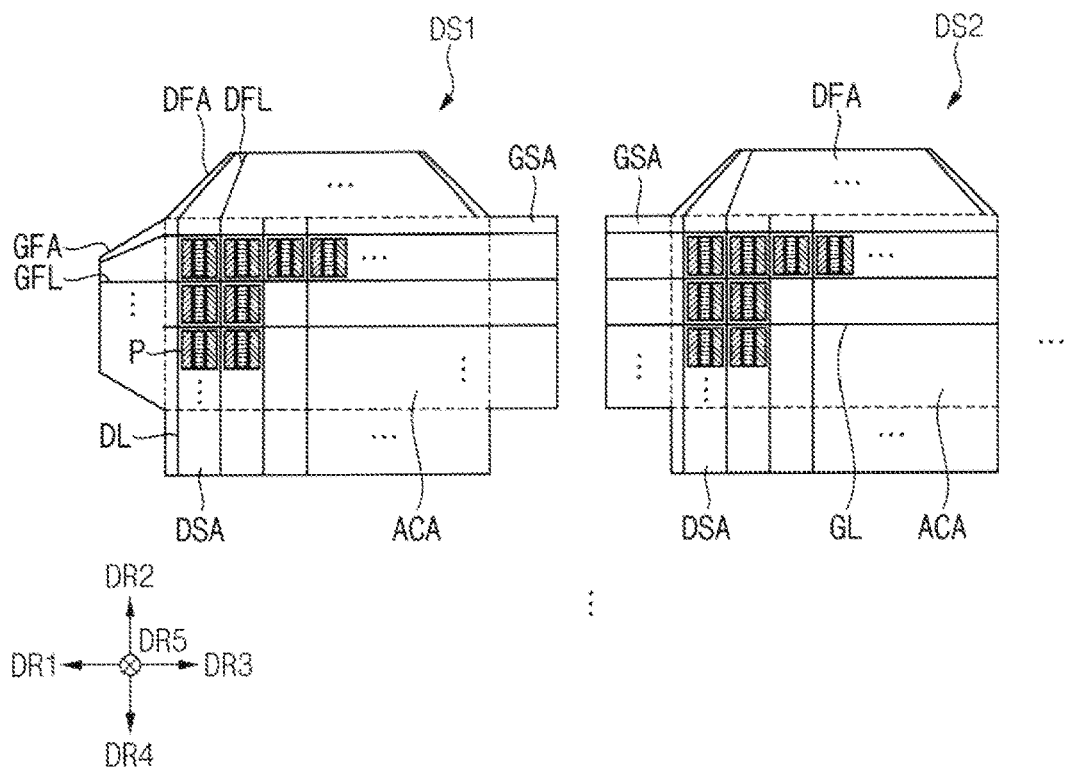

Referring to FIGS. 17 and 18, the display device may further include a second active panel DS2. The second active panel DS2 may be coupled to one side of the first active panel DS1. The second active panel DS2 may include an active area ACA, a gate transfer area GSA, a data fan-out area DFA, and a data transfer area DSA.

In the second active panel DS2, the data fan-out area DFA may be positioned in the second direction DR2 from the active area ACA. In addition, the gate transfer area GSA may be coupled to the active area ACA in the first direction DR1, and the data transfer area DSA may be positioned in the fourth direction DR4 from the active area ACA. The gate transfer area GSA and the data transfer area DSA of the second active panel DS2 may be bent in the fifth direction DR5.

In some embodiments, the first and second active panels DS1, DS2 may be electrically coupled to each other through the gate transfer area GSA. In some embodiments, the first and second active panels DS1, DS2 may be electrically coupled to each other by a connecting member. For example, the first and second active panels DS1, DS2 may be coupled by a connecting member such as, for example, an anisotropic conductive film, a connector, or solder joint. The connection member may contact the gate transfer area GSA of the first active panel DS1 and the gate transfer area GSA of the second active panel DS2. Through this connection, the connection member may transmit a gate signal between the first and second active panels DS1, DS2.

Figure 19:
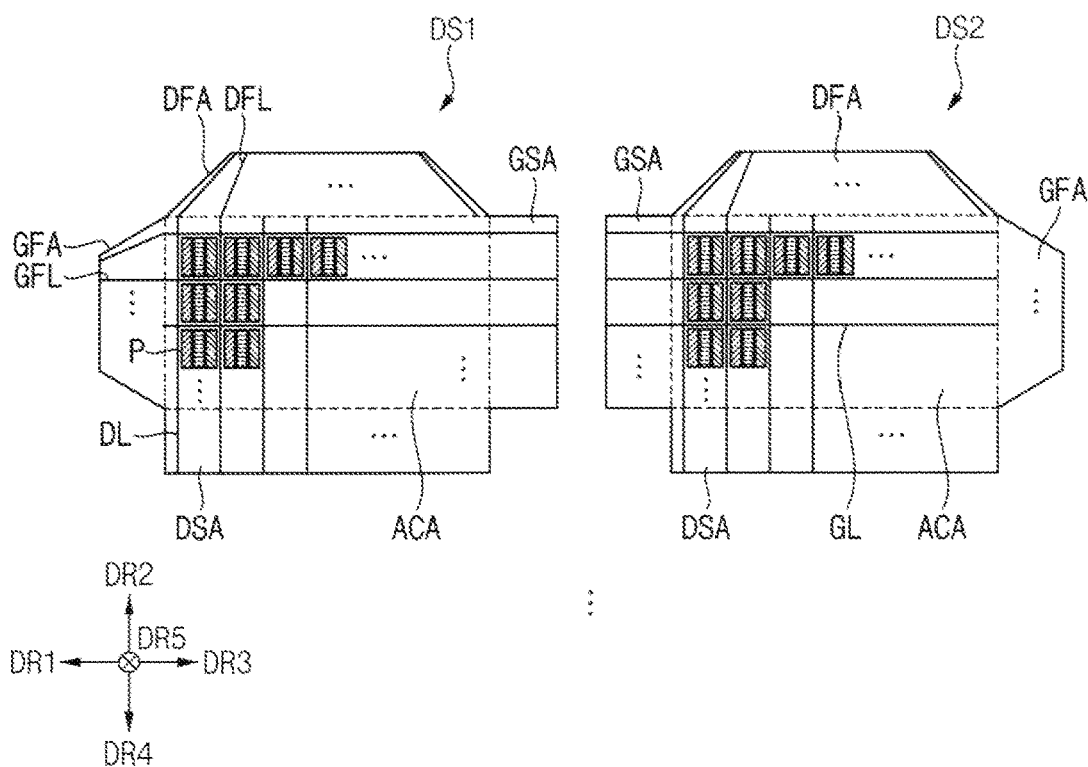

Referring to FIG. 19, in some embodiments, a gate fan-out area GFA may be positioned in the third direction DR3 from the second active panel DS2. Through this gate fan-out area GFA, the display device may provide a gate signal to the first and second active panels DS1, DS2 in the first direction DR1 and the third direction DR3.

In addition, the active panel positioned in the fourth direction DR4 from the first and second active panels DS1, DS2 may be coupled to the active panel through a data transfer area DSA.

Figure 20:
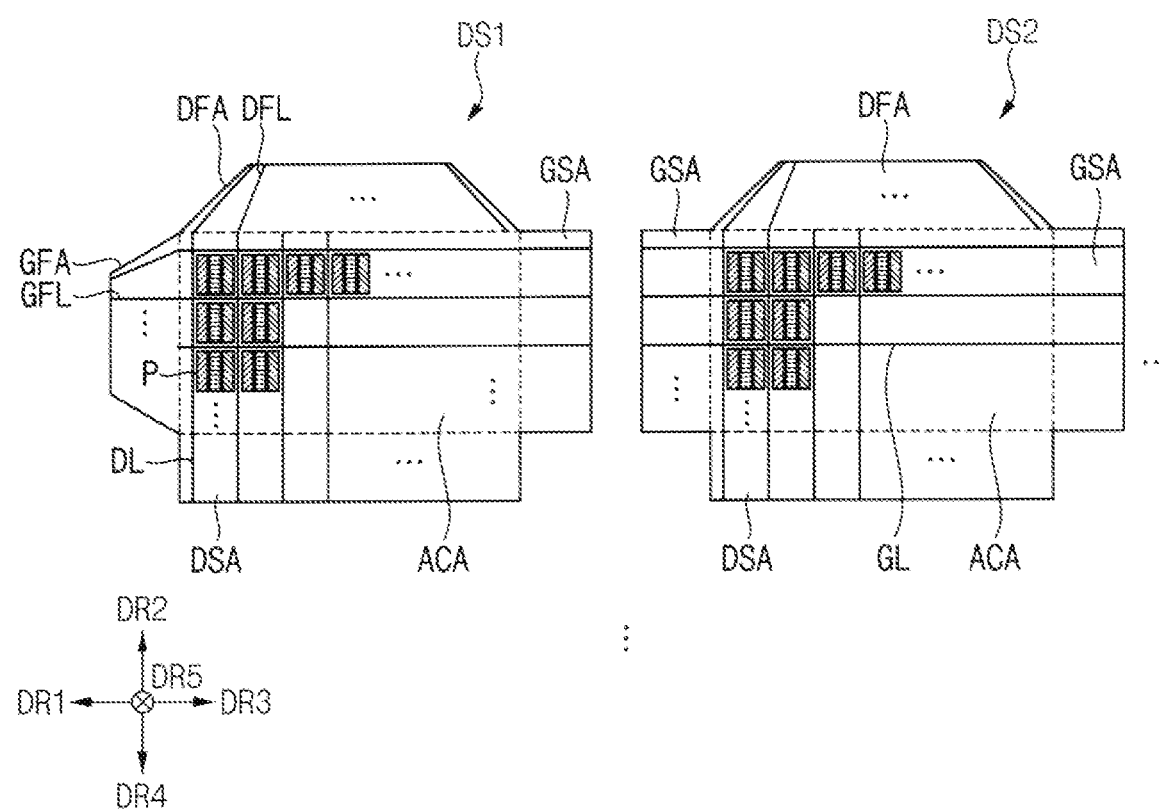

Referring to FIG. 20, in some embodiments, a gate transfer area GSA may be positioned in the third direction DR3 from the second active panel DS2. Through this gate transfer area GSA, the display device may be electrically coupled to the active panel located in the third direction DR3 from the second active panel DS2 through the gate transfer area GSA.

Figure 21:
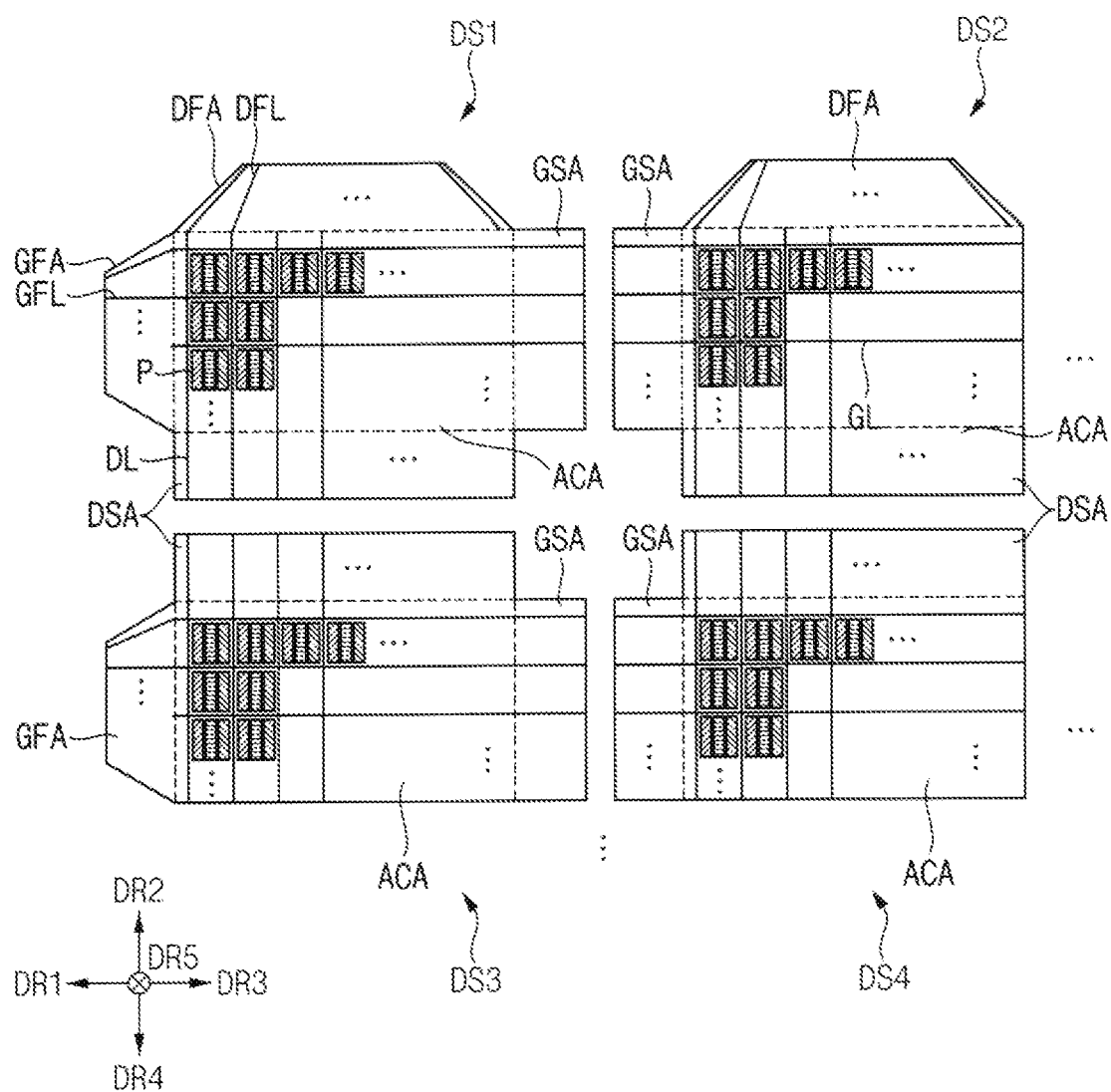

Referring to FIG. 21, the display device may further include a third active panel DS3 and a fourth active panel DS4.

The third active panel DS3 may include an active area ACA, a gate fan-out area GFA, and a data transfer area DSA. In some embodiments, the gate fan-out area GFA may be positioned in the first direction DR1 from the active area ACA, and the data transfer area DSA may be positioned in the second direction DR2 from the active area ACA, and the gate transfer area GSA may be positioned in the third direction DR3 from the active area ACA.

The fourth active panel DS4 may include an active area ACA, a gate transfer area GSA, and a data transfer area DSA. In some embodiments, the data transfer area DSA may be positioned in the second direction DR2 from the active area ACA. The gate transfer area GSA may be positioned in the first direction DR1 from the active area ACA.

In some embodiments, a data transfer area DSA and a gate transfer area GSA of the third active panel DS3 and a data transfer area DSA and a gate transfer area GSA of the fourth active panel DS4 may be bent in the fifth direction DR5. Each of the first to fourth active panels DS1 to DS4 may be coupled to each other by bending a gate transfer area GSA and a data transfer area DSA in the fifth direction DR5.

In this case, the first to fourth active panels DS1 to DS4 are coupled to operate as a tiled display device.

Figure 22:
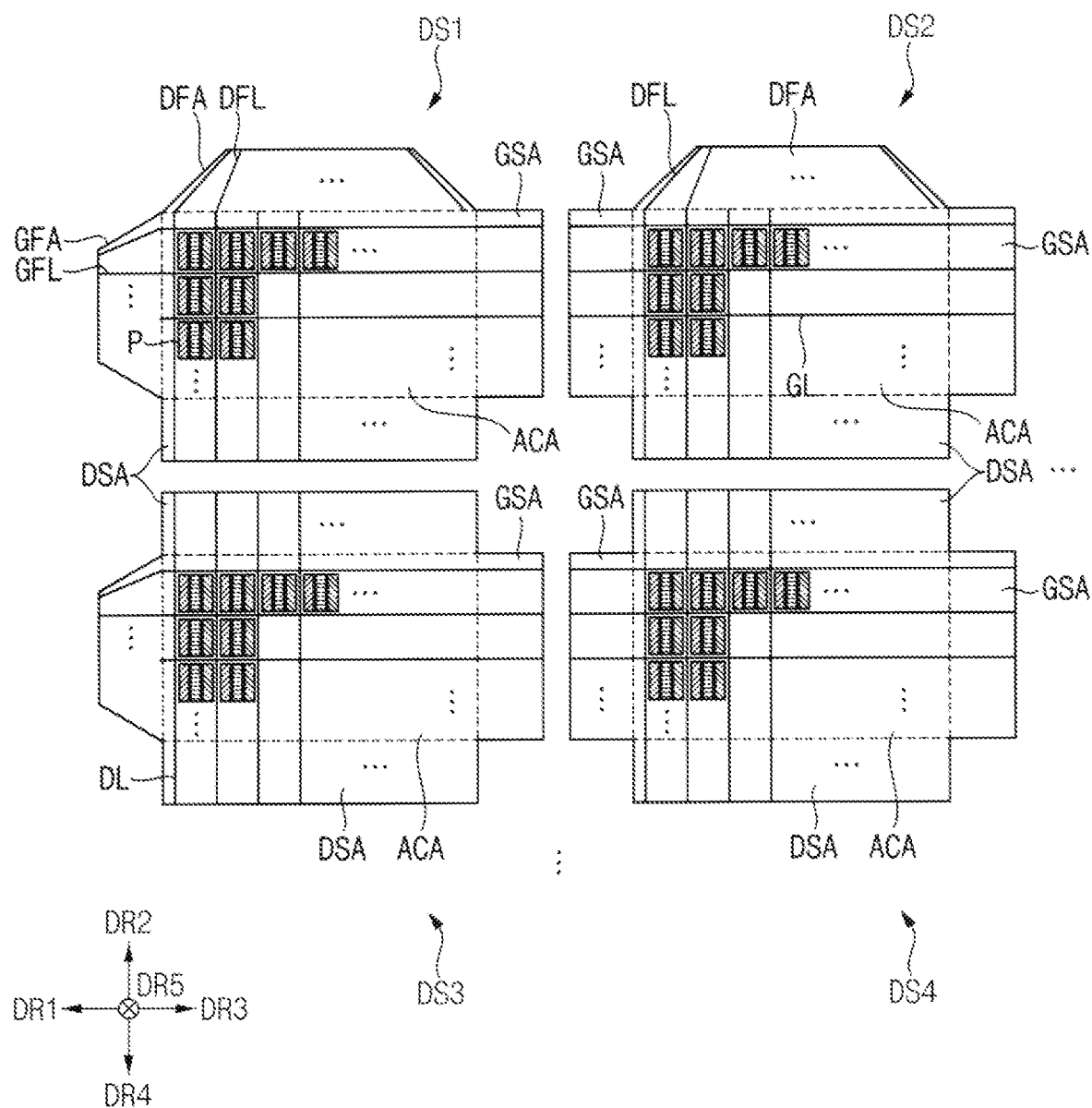

Referring to FIG. 22, the data transfer area DSA may also be positioned in the fourth direction DR4 from the third active panel DS3 and in the fourth direction DR4 from the fourth active panel DS4, respectively. The gate transfer area GSA may also be positioned in the third direction DR3 from the second active panel DS2 and in the third direction DR3 from the fourth active panel DS4, respectively.

In some embodiments, the first to fourth active panels DS1 to DS4 may be coupled to each other by bending each of the gate transfer area GSA and the data transfer area DSA in the fifth direction DR5. In some embodiments, additional display panels may be further coupled outside the second to fourth active panels DS2 to DS4.

Figure 23:
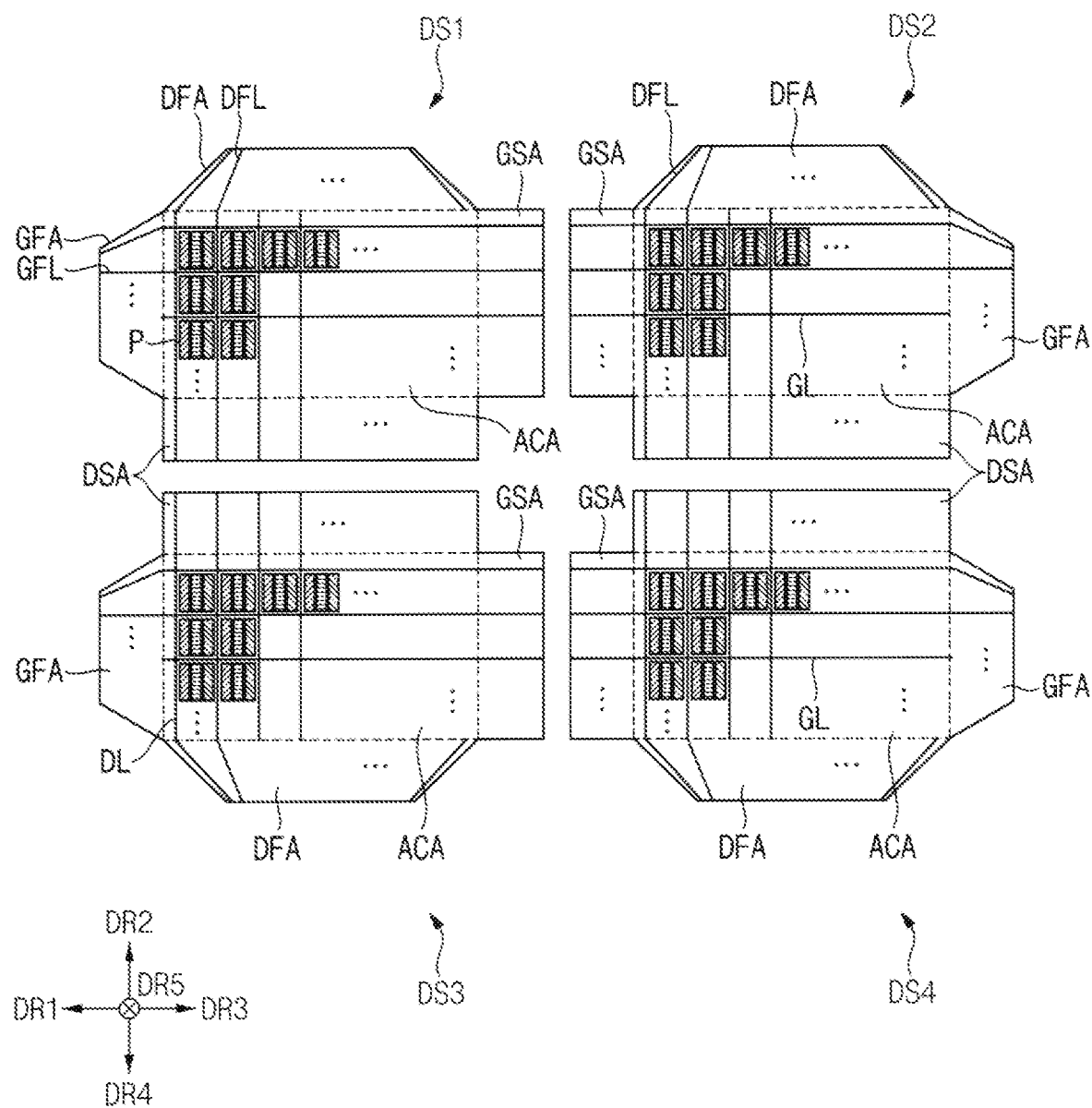

Referring to FIG. 23, the gate fan-out area GFA may be positioned in the third direction DR3 from the second active panel DS2 and the third direction DR3 from the fourth active panel DS4, respectively. The data fan-out area DFA may be positioned in the fourth direction DR4 from the third active panel DS3 and in the fourth direction DR4 from the fourth active panel DS4, respectively.

In some embodiments, the first to fourth active panels DS1 to DS4 may be coupled to each other by bending each of the gate transfer area GSA and the data transfer area DSA in the fifth direction DR5. In this case, the first to fourth active panels DS1 to DS4 may be coupled to operate as a tiled display device.

Figure 24:
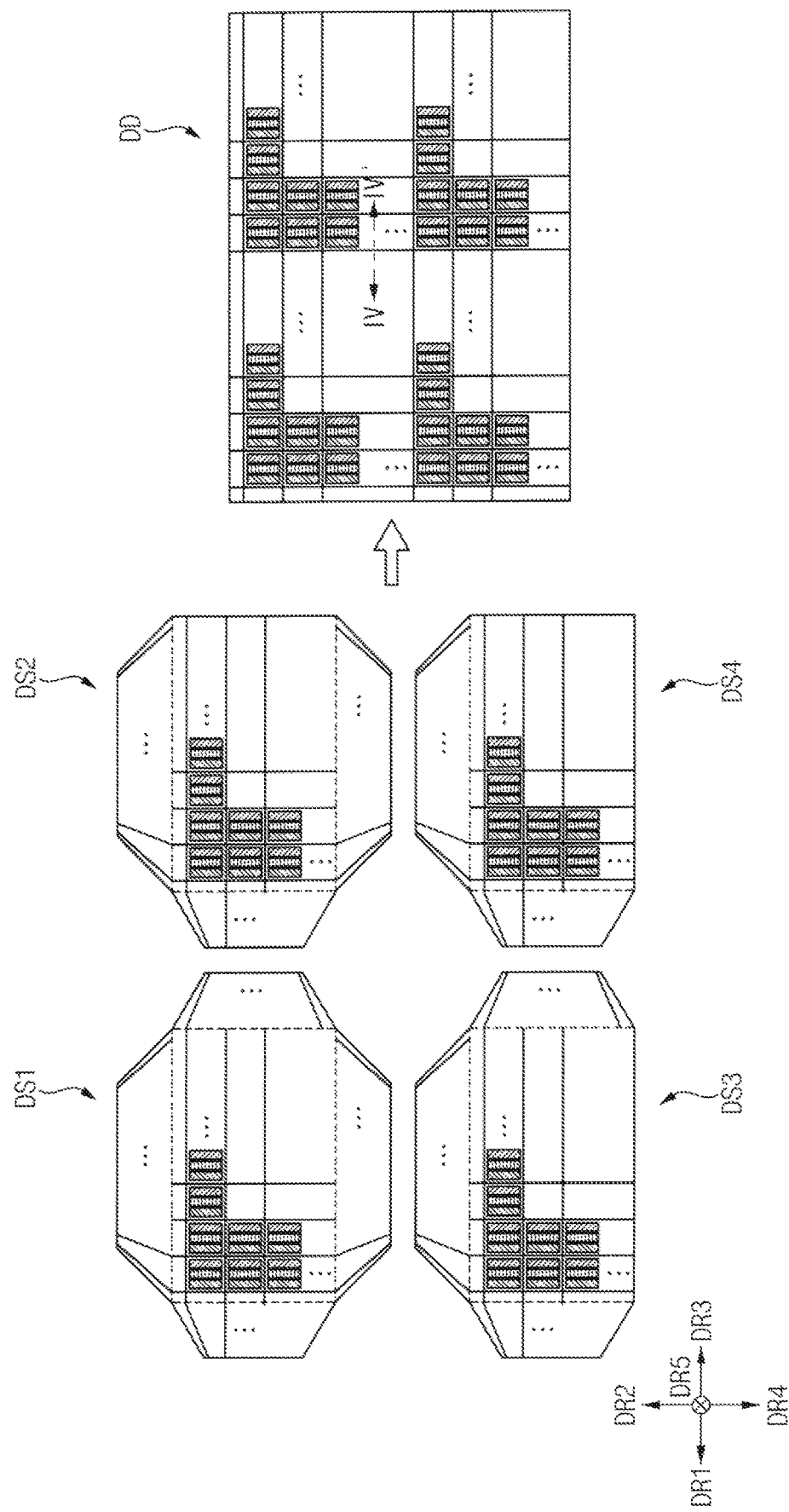
FIG. 24 is a plan view illustrating a display device according to some embodiments.
Figure 25:
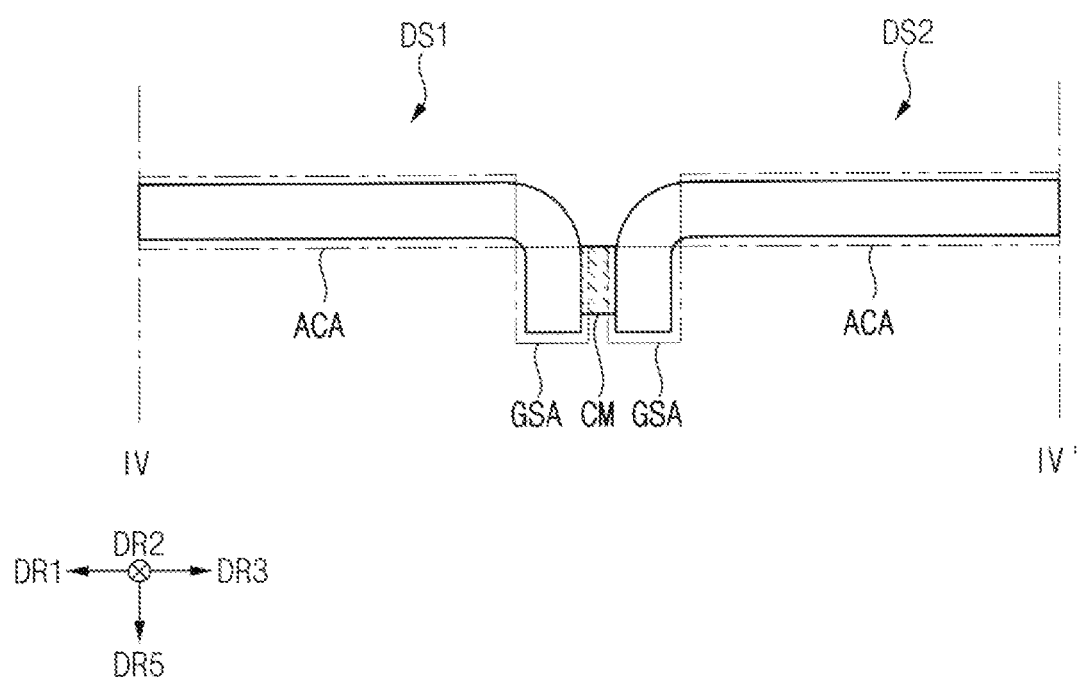
FIG. 25 is a cross-sectional view illustrating some embodiments taken along the line IV-IV' of FIG. 24.

FIG. 24 is a plan view illustrating a display device according to some embodiments, and FIG. 25 is a cross-sectional view illustrating some embodiments taken along the line IV-IV' of FIG. 24.

Referring to FIGS. 24 and 25, the above-described active panels DS1 to DS4 may be coupled to each other to operate as one display device DD. In this case, the display device DD may be defined as a tiled display device.

In the active panels DS1 to DS4, a gate transfer area GSA and a data transfer area DSA may be bent in the fifth direction DR5 to be coupled. In this case, the gate transfer area GSA may be coupled to the adjacent gate transfer area GSA by the connection member CM. The connection member CM may include an anisotropic conductive film, a connector, or a solder joint.

In some embodiments, adjacent data transfer areas DSA may also be coupled by the connection member CM. In some embodiments, the connection member CM connecting the gate transfer areas GSA and the connection member CM connecting the data transfer areas DSA may be of the same type, yet in other embodiments, the connection member CM connecting the gate transfer areas GSA and the connection member CM connecting the data transfer areas DSA may be different types. For example, the gate transfer areas GSA may be coupled by an anisotropic conductive film, and the data transfer areas DSA may be coupled by a connector.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those having ordinary skill in the art that various changes in form and details may be made therein without departing from the spirit or scope of the invention as defined by the following claims and their equivalents.

What is claimed is:

1. A display device comprising:
an active panel comprising:
a display area comprising a plurality of pixels; and
a non-display area surrounding the display area, the non-display area comprising an adjacent area adjacent the display area and bending areas extending from the adjacent area and spaced from the display area by the adjacent area, the bending areas comprising:
a connection electrode recessed below a surface of the bending areas;
a protective layer covering a part of the connection electrode; and
an opening in the bending areas exposing the connection electrode recessed below the surface through the protective layer; and
a first driving panel coupled with the connection electrode of a first bending area of the bending areas by a first connection member through the opening, and electrically coupled to the active panel, such that the first driving panel is spaced apart from the display area along a first direction parallel to a display surface of the display device and the first connection member is between a bent edge of the first driving panel and the first bending area along the first direction,
wherein each of the bending areas is bent in a second direction perpendicular to a plane formed by the display area, the first connection member coupling the first driving panel with the first bending area at the first bending area that is bent in the second direction, and
wherein the first connection member is configured to couple a first signal from the first driving panel to the active panel through the connection electrode.

2. The display device of claim 1, wherein the first connection member comprises an anisotropic conductive film, a connector, or a solder joint.

3. The display device of claim 1, further comprising:
a first support substrate, wherein the display area of the active panel is bonded to an upper surface of the first support substrate, and wherein the bending areas of the active panel are bonded to side surfaces of the first support substrate; and
a second support substrate, wherein the first driving panel is bonded to an upper surface of the second support substrate, and wherein the first driving panel is folded and bonded to a side surface of the second support substrate to form the bent edge of the first driving panel.

4. The display device of claim 3, wherein a width of the adjacent area is half a distance between adjacent pixels among the pixels.

5. The display device of claim 3, further comprising:
a second driving panel coupled to a second bending area bonded to a side surface of the first support substrate that is perpendicular to a side surface of the first support substrate that is bonded to the first bending area, among the side surfaces of the first support substrate,
wherein the second driving panel is configured to apply a second signal different from the first signal, and
wherein the active panel and the second driving panel are coupled by a second connection member.

6. The display device of claim 5, wherein the first driving panel is configured to apply a gate signal to the active panel, and the second driving panel is configured to apply a data signal to the active panel.

7. The display device of claim 3, further comprising:
a second driving panel coupled to a second bending area bonded to a side surface of the first support substrate opposite to a side surface of the first support substrate that is bonded to the first bending area, among the side surfaces of the first support substrate, and
wherein the active panel and the second driving panel are coupled by a second connection member.

8. The display device of claim 7, wherein the first and second driving panels are configured to apply a gate signal or a data signal to the active panel.

9. The display device of claim 1, wherein the first driving panel is configured to apply a data signal and a gate signal to the active panel.

10. The display device of claim 1, further comprising an alignment mark on at least one of the bending areas.

* * * * *